United States Patent
De Rochefort

(10) Patent No.: US 10,585,157 B2
(45) Date of Patent: Mar. 10, 2020

(54) METHOD AND DEVICE FOR IMAGING BY MAGNETIC RESONANCE

(71) Applicants: UNIVERSITE PARIS-SUD, Orsay (FR); CENTRE NATIONAL DE LA RECHERCHE SCIENTIFIQUE, Paris (FR)

(72) Inventor: Ludovic Marie Xavier De Rochefort, Cachan (FR)

(73) Assignees: UNIVERSITE PARIS-SUD, Orsay (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 37 days.

(21) Appl. No.: 15/573,340

(22) PCT Filed: May 12, 2016

(86) PCT No.: PCT/EP2016/060777
§ 371 (c)(1),
(2) Date: Nov. 10, 2017

(87) PCT Pub. No.: WO2016/180947
PCT Pub. Date: Nov. 17, 2016

(65) Prior Publication Data
US 2018/0136300 A1 May 17, 2018

(30) Foreign Application Priority Data
May 13, 2015 (FR) ...................................... 15 54358

(51) Int. Cl.
*G01V 3/00* (2006.01)
*G01R 33/58* (2006.01)
(Continued)

(52) U.S. Cl.
CPC .......... *G01R 33/586* (2013.01); *G01R 33/50* (2013.01); *G01R 33/54* (2013.01);
(Continued)

(58) Field of Classification Search
CPC ................................................. G01R 33/56366
(Continued)

(56) References Cited

U.S. PATENT DOCUMENTS

| 6,088,488 A | * | 7/2000 | Hardy | ....................... G06T 5/50 |
| | | | | 382/130 |
| 2006/0152219 A1 | | 7/2006 | Bieri et al. | |
| 2008/0197842 A1 | * | 8/2008 | Lustig | .................. G01R 33/561 |
| | | | | 324/307 |

OTHER PUBLICATIONS

French Search Report from French Patent Application No. 1554358, dated Mar. 17, 2016.
(Continued)

*Primary Examiner* — Louis M Arana
(74) *Attorney, Agent, or Firm* — Greer, Burns & Crain, Ltd.

(57) ABSTRACT

A MRI device includes: structure applying a main magnetic field on an axis Z over a sample zone; structure emitting a magnetic field gradient and structure emitting a radiofrequency pulse, and a controller. The controller performs on the sample zone, a sequence including: a radiofrequency pulse and/or phase at each repetition; and a spatial gradient of the component along the Z axis. The controller is programmed so that, in the course of repeated applications of the pulse and of the gradient of the sequence of one and the same set: the radio frequency pulse follows, between its repeated applications, a periodic series for its amplitude and for a series U+t=v+i−v; and each repeated application of the gradient of magnetic field of the sequence a, according to a coding spatial direction, a non zero timing integral equal to A and identical for each application of gradient of this set.

32 Claims, 7 Drawing Sheets

(51) Int. Cl.
  *G01R 33/50* (2006.01)
  *G01R 33/54* (2006.01)
  *G01R 33/561* (2006.01)
  *G01R 33/563* (2006.01)
  *G01R 33/44* (2006.01)
(52) U.S. Cl.
  CPC ... *G01R 33/5613* (2013.01); *G01R 33/56341* (2013.01); *G01R 33/448* (2013.01)
(58) Field of Classification Search
  USPC .................................. 324/306, 309, 307
  See application file for complete search history.

(56) References Cited

OTHER PUBLICATIONS

International Search Report from International Patent Application No. PCT/EP2016/060777, dated Sep. 2, 2016.
Written Opinion from International Patent Application No. PCT/EP2016/060777, dated Sep. 2, 2016.
Bieri et al., "Quantitative In Vivo Diffusion Imaging of Cartilage Using Double Echo Steady-State Free Precession", Magnetic Resonance in Medicine (2012), 68(3), pp. 720-729.
Bruder et al., "A New Steady-State Imaging Sequence for Simultaneous Acquisition of Two MR Images with Clearly Different Contrasts", Magnetic Resonance in Medicine (1988), 7(1), pp. 35-42.
Ganter et al., "B1+-Mapping with the Transient Phase of Unbalanced Steady-State Free Precession", Magnetic Resonance in Medicine (2013), 70(6), pp. 1515-1523.
Hurley et al., "Simultaneous Variable Flip Angle-Actual Flip Angle Imaging Method for Improved Accuracy and Precision of Three Dimensional T1 and B1 Measurements", Magnetic Resonance in Medicine (2012), 68(1), pp. 54-64.
Liberman et al., "T1 Mapping Using Variable Flip Angle SPGR Data with Flip Angle Correction", Journal of Magnetic Resonance Imaging (2014), 40(1), pp. 171-180.
Loureiro de Sousa et al., "Factor Controlling T2 Mapping from Partially Spoiled SSFP Sequence: Optimization for Skeletal Muscle Characterization", Magnetic Resonance in Medicine (2012), 67(5), pp. 1379-1390.
Ma et al., "Magnetic Resonance Fingerprinting", Nature (2013), 495(7440), pp. 187-193.
Schabel et al., "Uncertainty in T1 Mapping Using the Variable Flip Angle Method with Two Flip Angles", Physics in Medicine and Biology (2009), 54(1), pp. N1-N8.

\* cited by examiner

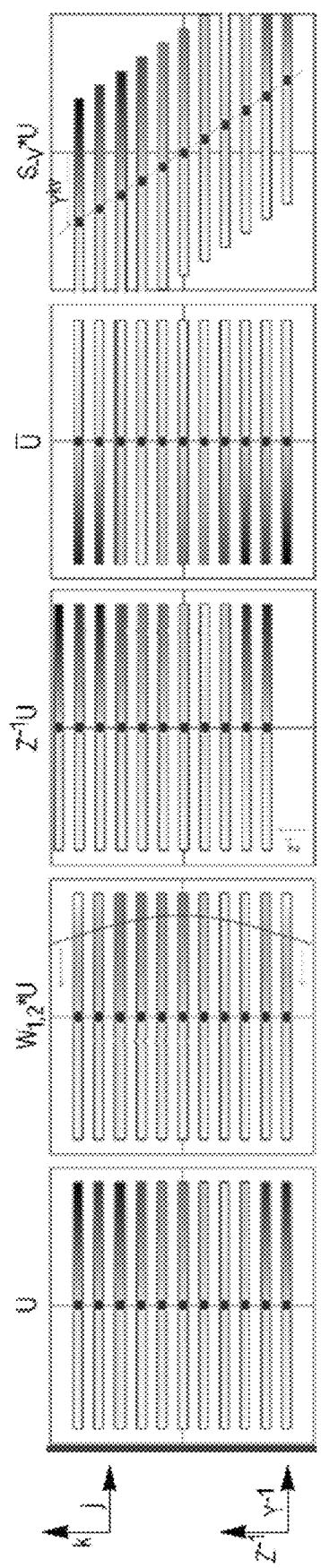
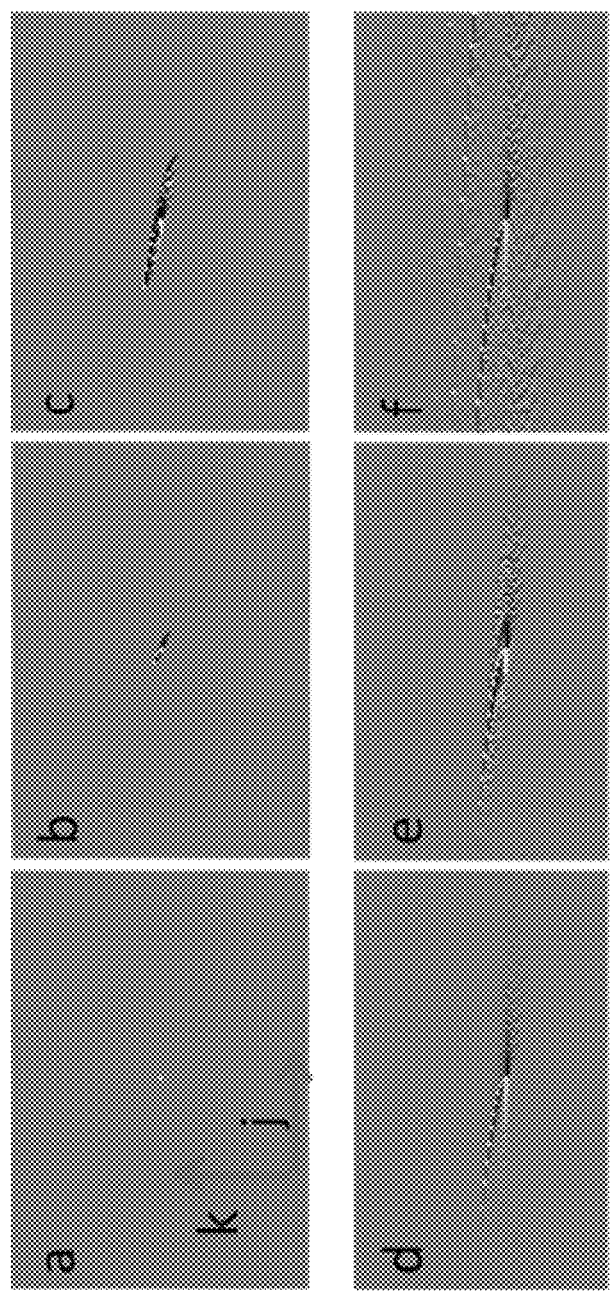
FIG. 3

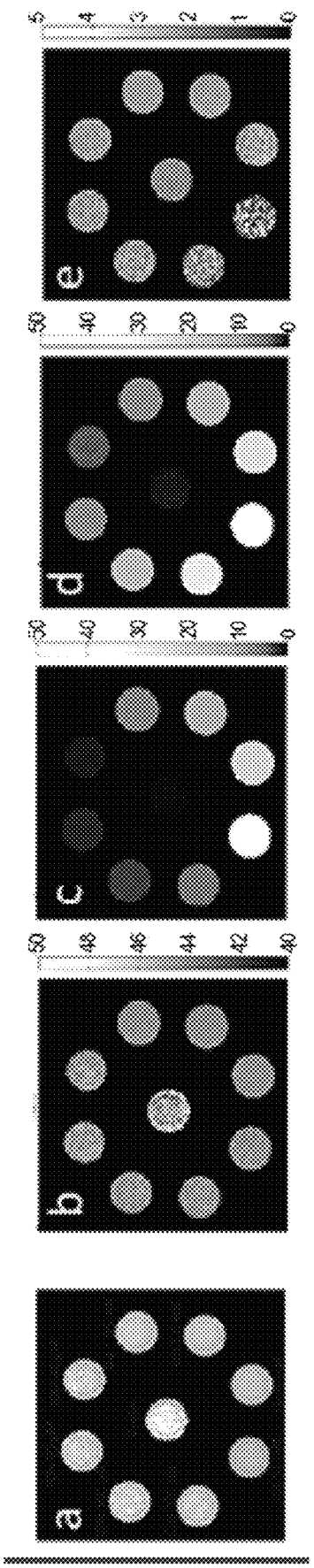
FIG. 8
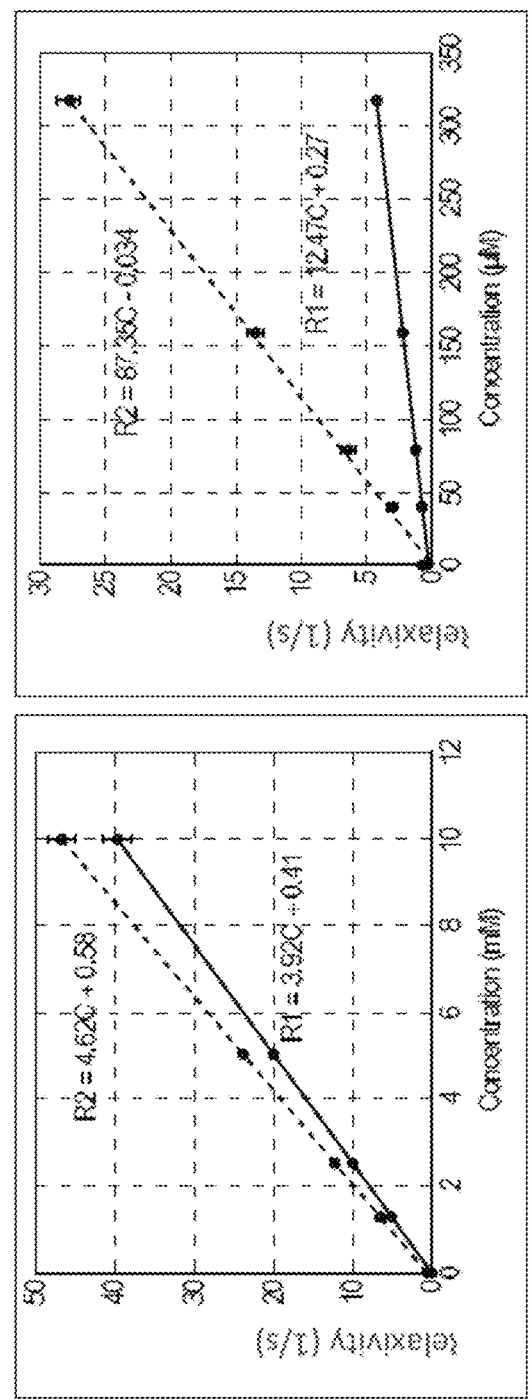
FIG. 9a
FIG. 9b

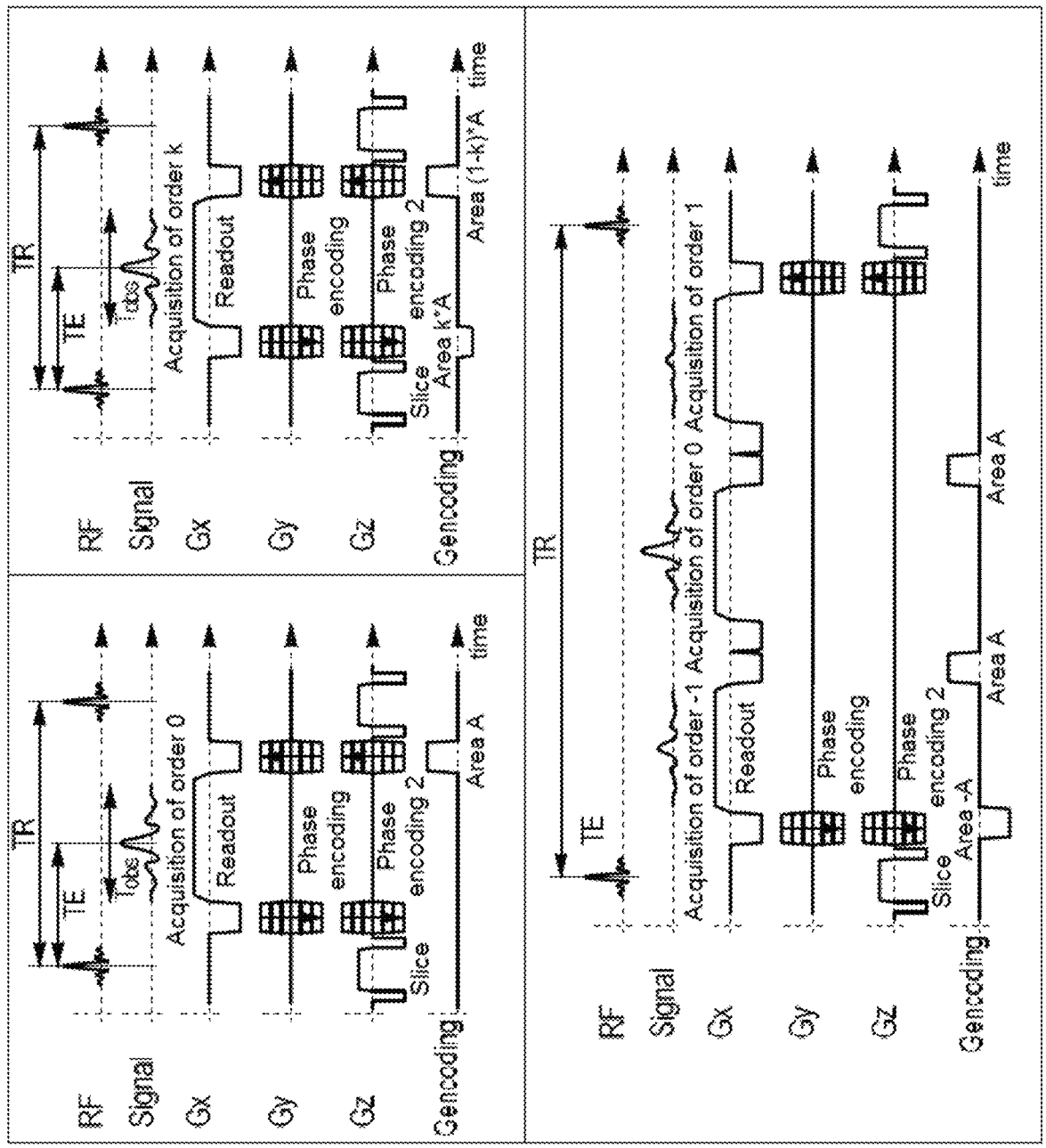

METHOD AND DEVICE FOR IMAGING BY MAGNETIC RESONANCE

BACKGROUND

The present invention relates to a method for magnetic resonance imaging (MRI). It also relates to a device implementing this method.

Such a method or device can for example preferably allow a user to generate and use co-localized images, of the same spatial resolution, the same echo time (TE) and repetition time (TR) for nuclear magnetization, longitudinal (T1) and transverse (T2) relaxation times, the diffusion coefficient (D), the amplitude of the radiofrequency field (B1) and the inhomogeneities of the main magnetic field $B_0$.

MRI is a clinical and pre-clinical imaging method used routinely in radiological medical diagnosis or for the assessment of animal models. Its non-invasive aspect and the multiple contrasts available make it indispensable in the assessment of numerous illnesses. A typical MRI examination contains a protocol for the acquisition of several imaging sequences, each having a different objective. The sequences called "proton density" sequences will provide information on the quantity of free water in the tissue. The sequences called "T1-weighted" generally serve for anatomical assessment, as they generate a good contrast between the biological tissues. The "T1-weighted" sequences also serve for visualizing contrast agents that can be injected during angiography or for tumor characterization. The sequences called "T2-weighted" have the overall property of making it possible to clearly distinguish the liquid contents and provide information for example on the presence of edemas. Further, contrast agents called T2 can be used in order to modulate the T2 weighting for some applications. The diffusion, which also influences the contrast of the images generated with particular sequences called "diffusion-weighted" are also used in order to extend the tissue characterization, for example in order to distinguish the viable areas from the necrotic areas in tumors; a distinction that is not always possible with the other types of weighting, or in order to carry out tractography of cerebral fibers based on the predominant water diffusion direction. Depending on the illness investigated and the anatomical area, several sequences are applied during an examination. These are applied sequentially, which as it is, requires a period of time for parametering for the electroradiological manipulators in order to adapt each sequence to the area under investigation. Due to constraints of acquisition time, of the weighting and localization type, the different items of information are generally not acquired with the same spatial resolution, do not cover the same fields of view and can even be affected by different spatial deformations, depending in particular on the different echo times and bandwidths of acquisition. There may be mentioned for example the need in some cases to resort to a subsequent correction of the images or to image retiming techniques in order to partially compensate for these effects. These aspects contribute to making MRI either limited to an interpretation based exclusively on visual comparisons, or introducing bias or imprecision factors resulting from correction algorithms. In order to improve diagnosis, there is therefore a need to be able to co-localize the different items of information exactly on the scale of the same imaging voxels.

Furthermore, the choice of the sequences applied and the parametering of the sequences is the responsibility of each radiology center, and the utilizations of the sequences may vary between manufacturers. There is no standard for a sequence and for the associated parameters applicable in all cases. These elements make multi-center comparisons of imaging results difficult, and slow down or even prevent a consensus being reached on the sequences and on the parametering thereof. In order to make diagnosis more reliable, the direct quantification of the physical parameters such as nuclear magnetization, T1 and T2, and the diffusion coefficient is a possibility that makes it possible to standardize the imaging results.

Further, in order to quantify the different parameters T1, T2 and the diffusion coefficient, multiple sequences exist, each adapted to the parameter to be quantified. There may be mentioned for example the inversion-recovery sequence with several inversion times for quantifying T1, the spin-echo sequence with several spin-echo times for quantifying T2, the diffusion-weighted spin-echo sequence for quantifying the diffusion coefficient. These different sensitization patterns can then be combined with different sequences, allowing localization with all the aforementioned drawbacks of spatial deformation between the acquisitions, of different field of view or area covered, reducing the possibility of pairing the extracted parameters voxel by voxel.

A standard rapid acquisition sequence is based on rapid-gradient echo. This imaging sequence consists of repeating a pattern every TR including a fixed-amplitude excitation, optionally combined with a gradient called a "selection" gradient, in order to carry out a spatial selection, followed by imaging gradients (for readout and phase encoding). Multiple variants of this sequence have been proposed. In order to synthesize the differences between the variants, the following elements will be noted:

the total compensation of the gradient areas between repetitions (sequence called balanced sequence), or the opposite, the non-compensation of this gradient area (sequence called non-balanced sequence). This last unbalanced variant creates different coherence orders that can optionally be exploited. A coherence order is denoted k. This is an integer that corresponds to the discrete Fourier series order that can be used in order to describe the configuration states of magnetization, as proposed and utilized in the state of the art.

The particular cycling of the phase $\theta_n$ of the radiofrequency pulse at repetition n without changing its amplitude with $\theta_{n+1}=\theta_n+(n+1)\Delta$. The variants work either at fixed-phase as a function of the repetitions ($\Delta=0$), or with a quadratic phase cycling ($\Delta \neq 0$), equivalent to a constant and non-zero increment $\Delta$ from one repetition to another. Of course, $\Delta$ is defined modulo $2\pi$.

The measurement between the pulses for 1 or more echoes, in particular corresponding to the phase coherence orders (k=0, generally the only one acquired, and/or k=−1 and/or k=1 which may also be the case.

The addition or not of additional gradients between the pulses in order to differently sensitize the diffusion The acquisition of the signal during the transient phase or during the stationary phase. For the transient phase, the starting magnetization can be the state of thermal equilibrium or a state prepared using preparation patterns and the information used for the analysis is the variation in the signal as a function of the repetitions. In contrast, the stationary acquisition is based on the acquisition of a dynamic steady state reached following several repetitions.

It should be noted here that the magnetization can be decomposed into a component aligned on the main magnetic field $B_0$, called longitudinal component, and a transverse component, the latter capable of being detected by induction in a radiofrequency detector and capable of being spatially modulated with the gradients. It should be noted that the effect of a radiofrequency pulse applied to resonance and amplitude B1(t) of phase phi (with respect to an internal reference of the RF synthesizers) and applied for a duration T is to flip the magnetization of an angle α with $B_0$, the angle being proportional to the integral of the RF field for the duration T, the axis of rotation itself being shifted by θ=phi+π/2 radians with respect to the frame of reference rotating at resonance. It should be noted that the longitudinal and transverse components relax with a characteristic time T1 and T2, respectively, this time being dependent on the local environment and possibly influenced by the magnetization transfer. Finally, it should be noted that the atoms or molecules carrying nuclear magnetization diffuse over time, which is described macroscopically by the Bloch-Torrey equations.

A significant complexity in the rapid sequences (generally with TR<T2), is that the transverse component that is dephased with the gradients and with the field inhomogeneities is "recycled" by the following excitation transferring a part longitudinally and reciprocally. This dephasing remaining between two pulses, combined with the non-suppression of the magnetization by the purely dispersive phenomena of relaxation and diffusion, is at the origin of different k states as previously mentioned. It is then difficult to describe the magnetization including the effects of relaxation, diffusion, angle, and a person skilled in the art often also reports that it is impossible to describe the effects, thus the limitation under certain restrictive conditions of validity or even confusion over the creation of coherence states when the phase is modulated, or finally the negation of diffusion effects.

The purpose of the present invention is to overcome at least one of the following problems of the state of the art:
proposing a new type of sequence or new forms of steady state, and/or
facilitating a determination, with respect to the Ernst angle, of the effect of the radiofrequency pulse producing the flip angle, and/or
determining in a quasi-simultaneous manner, several parameters from a nuclear magnetization, a flip angle of the magnetization, a diffusion coefficient, a longitudinal rate or time R1 or T1, and a transverse relaxation rate or time R2 or T2 of one and the same point in space, and/or
improving taking account of diffusion.

SUMMARY

This purpose is achieved with a magnetic resonance imaging method, comprising:
applying (preferably continuously) a main magnetic field $B_0$ along a Z-axis on a sample, and
at least one set of repeated applications, on the sample and according to a period TR, of a sequence, said sequence comprising:
a radiofrequency pulse optionally of variable amplitude and/or phase at each repetition, and
after the radiofrequency pulse of the sequence, a spatial gradient of the component along the Z-axis of the magnetic field,
characterized in that, during repeated applications of the radiofrequency pulse and of the magnetic field spatial gradient of the sequence of one and the same set:
the radiofrequency follows, between its different repeated applications, a periodic series:
for its amplitude, and
for $u_{n+1}=v_{n+1}-v_n$, where n is a integer greater than or equal to 1 representing the repetition number of the sequence for this set, and where $u_{n+1}$ is a relative integer series that makes it possible to define the series $v_n$ to the nearest arbitrary constant $v_1$ such that $\varphi_n=v_n\times\Delta$ and $\varphi_n=\theta_n-\theta_{n-1}$ with $\Delta$ which is a constant real number for all the repeated applications of the sequence of this set and $\varphi_n$ which is the increment between the phase $\theta_n$ of the radiofrequency pulse at its $n^{th}$ repetition in this set and phase $\theta_{n-1}$ of the radiofrequency pulse at its $(n-1)^{th}$ repetition in this set, with $\theta_0$ an arbitrary value, and
each repeated application of the magnetic field spatial gradient of the sequence has, in a spatial gradient direction called encoding direction identical for each gradient application of this set, a temporal integral equal to non-zero A (and preferably identical for each gradient application of this set).

The method according to the invention preferably also comprises an acquisition, during at least one of the repetitions of the sequence, of at least one nuclear magnetic resonance signal.

During repeated applications of the radiofrequency pulse and of the magnetic field spatial gradient of the sequence of one and the same set, the series $u_{n+1}=v_{n+1}-v_n$ can be a non-constant periodic series.

During repeated applications of the radiofrequency pulse and of the magnetic field spatial gradient of the sequence of one and the same set, the amplitude of the radiofrequency pulse can follow a non-constant periodic series.

Preferably, the nuclear magnetic resonance signal is acquired at at least one dynamic steady state magnetization of the sample.

During repeated applications of the radiofrequency pulse and of the magnetic field spatial gradient of the sequence of one and the same set:
the series $u_{n+1}=v_{n+1}-v_n$ can be a non-constant periodic series, and/or
the amplitude of the radiofrequency pulse can follow a non-constant periodic series, so as to obtain different steady states of magnetization of the sample, interleaved within this set, respectively for different periodic values of the series $u_{n+1}=v_{n+1}-v_n$ and/or of the amplitude of the radiofrequency pulse, and preferably the nuclear magnetic resonance signal is acquired at these different interleaved steady states.

Several sets can be transmitted sequentially, with:
$\Delta$ the value of which differs between the different sets, and/or
the amplitude of the radiofrequency pulse that follows a periodic series that differs between the different sets,
so as to obtain different sequential steady states of magnetization for different values of $\Delta$ and/or of amplitude, including at least one steady state per set, and preferably the nuclear magnetic resonance signal is acquired at these different sequential steady states.

The method according to the invention can comprise:
an acquisition of a signal for two steady states corresponding to two identical amplitudes of the radiofrequency pulse but two different values of $\Delta$,
a comparison of the signal for these two steady states, and
a deduction, based on this comparison, of whether the amplitude of the radiofrequency pulse produces an effective flip angle greater than or smaller than or equal to the Ernst angle for the sample;

in this case, one of the two different values of Δ is preferably equal to zero.

The method according to the invention can comprise:
acquiring a signal for steady states corresponding to different amplitudes of the radiofrequency pulse and/or different values of Δ and/or different values of the periodic series $u_{n+1}=v_{n+1}-v_n$, constant or not, and for at least one point in the sample, determining at least one data item (preferably at least three, preferably all) from a nuclear magnetization, a magnetization flip angle, a diffusion coefficient, a longitudinal relaxation rate or time R1 or T1, and a transverse relaxation rate or time R2 or T2, based on the signal acquired for these steady states;

in this case:
the determination being preferably carried out either by comparison with a pre-calculated dictionary, or by iterative estimation, according to a minimization of a norm of the difference between the acquired signal expressed in complex form with a real part and an imaginary part and a model of the signal expressed in complex form with a real part and an imaginary part. The minimization can comprise a least-square minimization algorithm, preferably using the Gauss-Newton algorithm applied to non-linear problems; and/or the method according to the invention can comprise acquiring a signal for steady states corresponding to different Δ states, including:
several points, for an absolute value of Δ between Δ=0° inclusive and Δ=32° inclusive modulo 360°, and/or
several points, for an absolute value of Δ between Δ=164° inclusive et Δ=196° inclusive modulo 360°, and/or
several points, for an absolute value of Δ between Δ=112 inclusive et Δ=128° inclusive modulo 360°, and/or
several points, for an absolute value of Δ from Δ 45°, 60°, 72°, 90°, et 144° modulo 360°; and/or the amplitude of the radiofrequency pulse preferably always corresponds to a magnetization flip angle:
greater than the Ernst angle for a longitudinal relaxation time T1 equal to 2000 milliseconds, and/or
less than or equal to 90°; and/or the determination can comprise a spatial continuity condition of each data item determined from the nuclear magnetization, the magnetization flip angle, the diffusion coefficient, the longitudinal relaxation rate or time R1 or T1, and the transverse relaxation rate or time R2 or T2 between different points of the sample.

Several sets can be transmitted sequentially, with:
the encoding direction differing between different sets, and/or
the value of Δ differing between different sets, and/or
the shape of the magnetic field gradient in the encoding direction differs between different sets;

in this case, the method according to the invention preferably also comprises:
quantifying a diffusion coefficient in the sample or
determining a predominant direction of diffusion in the sample or
a weighting of the diffusion in the sample.

by exploiting the difference in A and/or the encoding direction and/or gradient waveform between the different sets.

According to yet another aspect of the invention, a magnetic resonance imaging device is proposed, comprising:

means for applying, preferably continuously, a main magnetic field $B_0$ along a Z-axis on a sample area, and means for transmitting a magnetic field gradient and means for transmitting a radiofrequency pulse, and control means arranged in order to control the means for transmitting a magnetic field gradient and the means for transmitting a radiofrequency pulse, the control means being arranged or programmed in order to carry out at least one set of repeated applications, on the sample area and according to a period TR, of a sequence, said sequence comprising:
a radiofrequency pulse optionally of variable amplitude and/or phase at each repetition, and
after the radiofrequency pulse of the sequence, a spatial gradient of the component along the Z-axis of the magnetic field, characterized in that the control means are arranged or programmed so that, during repeated applications of the radiofrequency pulse and of the magnetic field spatial gradient of the sequence of one and the same set:
the radiofrequency pulse follows, between its different repeated applications, a periodic series:
for its amplitude, and
for $u_{n+1}=v_{n+1}-v_n$, where n is a integer greater than or equal to 1 representing the repetition number for this set, and where $u_{n+1}$ is a relative integer series that makes it possible to define the series $v_n$ to the nearest arbitrary constant $v_1$ such that $\varphi_n=v_n \times \Delta$ and $\varphi_n=\theta_n-\theta_{n-1}$, with Δ which is a constant real number for all the repeated applications of the sequence of this set and $\varphi_n$ which is the increment between the phase $\theta_n$ of the radiofrequency pulse at its $n^{th}$ repetition in this set and the phase $\theta_{n-1}$ of the radiofrequency pulse at its $(n-1)^{th}$ repetition in this set, with $\theta_0$ an arbitrary value, and each repeated application of the magnetic field spatial gradient of the sequence has, in a spatial gradient direction called encoding direction identical for each gradient application of this set, a temporal integral equal to non-zero A (and preferably identical for each gradient application of this set).

The device according to the invention also preferably comprises means for acquiring, during at least one of the repetitions of the sequence, at least one nuclear magnetic resonance signal.

The control means can be arranged or programmed so that, during repeated applications of the radiofrequency pulse and of the magnetic field spatial gradient of the sequence of one and the same set, the series $u_{n+1}=v_{n+1}-v_n$ is a non-constant periodic series.

The control means can be arranged or programmed so that, during repeated applications of the radiofrequency pulse and of the magnetic field spatial gradient of the sequence of one and the same set, the amplitude of the radiofrequency pulse follows a non-constant periodic series.

The control means are also preferably arranged or programmed in order to control the acquisition means so as to acquire the nuclear magnetic resonance signal at at least one dynamic steady state of magnetization in the sample area.

The control means can be arranged or programmed so that, during repeated applications of the radiofrequency pulse and of the magnetic field spatial gradient of the sequence of one and the same set:
the series $u_{n+1}=v_{n+1}-v_n$ is a non-constant periodic series, and/or
the amplitude of the radiofrequency pulse follows a non-constant periodic series, so as to obtain different interleaved steady states of the magnetization in the sample area within this set respectively for different periodic values of the series $u_{n+1}=v_{n+1}-v_n$ and/or of the amplitude of the radiofrequency pulse, the control means also preferably being arranged or programmed in order to control the acquisition means so as to acquire the nuclear magnetic resonance signal at these different interleaved steady states.

The control means can be arranged or programmed so that several sets are transmitted sequentially, with:
  Δ the value of which differs between the different sets, and/or
  the amplitude of the radiofrequency pulse that follows a periodic series that differs between the different sets,
so as to obtain different sequential steady states of the magnetization in the sample area for different periodic values of Δ and/or of the amplitude including at least one steady state per set, the control means also preferably being arranged or programmed in order to control the acquisition means so as to acquire the nuclear magnetic resonance signal at these different sequential steady states.

The control means are arranged or programmed in order to control the acquisition means so as to acquire a signal for two steady states corresponding to two identical amplitudes of the radiofrequency pulses but two different values of Δ, the device also comprising calculation means arranged or programmed in order to:
  compare the signal for these two steady states, and
  deduce, based on this comparison, whether the amplitude of the radiofrequency pulse produces an effective flip angle that is larger or smaller than or equal to the Ernst angle in the sample area;
in this case, one of the two different values of Δ is preferably equal to zero.

The control means can be arranged or programmed in order to control the acquisition means so as to acquire a signal for steady states corresponding to different amplitudes of the radiofrequency pulses and/or different values of Δ and/or different values of the periodic series $u_{n+1}=v_{n+1}-v_n$, constant or not, the device also preferably comprising calculation means arranged or programmed in order to determine, for at least one point in the sample area, at least one data item (preferably at least three, preferably all) from a nuclear magnetization, a magnetization flip angle, a diffusion coefficient, a longitudinal relaxation rate or time R1 or T1, and a transverse relaxation rate or time R2 or T2, based on a signal acquired for these steady states;
in this case:
  the calculation means are preferably arranged or programmed in order to perform this determination, either by comparison with a pre-calculated dictionary, or by iterative estimation, according to a minimization of a norm of the difference between the acquired signal expressed in complex form with a real part and an imaginary part, and a model of the signal expressed in complex form with a real part and an imaginary part. The minimization can comprise a least-square minimization algorithm, preferably using the Gauss-Newton algorithm applied to non-linear problems; and/or
  the control means can be arranged or programmed in order to control the acquisition means so as to acquire a signal for steady states corresponding to different values of Δ including:
    several points, for an absolute value of Δ between Δ=0° inclusive and Δ=32° inclusive modulo 3600, and/or
    several points, for an absolute value of Δ between Δ=164° inclusive et Δ=196° inclusive modulo 360°, and/or
    several points, for an absolute value of Δ between Δ=112° inclusive et Δ=128° inclusive modulo 360°, and/or
    several points, for an absolute value of Δ from Δ 45°, 60°, 72°, 90°, et 144° modulo 360°; and/or
  the control means are preferably arranged or programmed so that the amplitude of the radiofrequency pulse always corresponds to a magnetization flip angle:
    greater than the Ernst angle for a longitudinal relaxation time T1 equal to 2000 milliseconds, and/or
    less than or equal to 90°; and/or
  the calculation means can be arranged or programmed so that the determination comprises a spatial continuity condition of each data item determined from nuclear magnetization, the magnetization flip angle, the diffusion coefficient, the longitudinal relaxation rate or time R1 or T1, and the transverse relaxation rate or time R2 or T2 between different points of the sample area.

The control means can be arranged or programmed in order to sequentially transmit several sets, so that:
  the encoding direction differs between different sets, and/or
  the value of Δ differs between two sets, and/or
  the shape of the magnetic field gradient in the encoding direction differs between different sets;
in this case, the device according to the invention can also comprise calculation means arranged or programmed for:
  quantifying a diffusion coefficient in the sample area or
  determining a predominant direction of diffusion in the sample area or
  weighting the diffusion in the sample area,
by exploiting the difference in A and/or the encoding direction and/or gradient waveform between the different sets.

BRIEF DESCRIPTION OF THE DRAWINGS

Other advantages and characteristics of the invention will become apparent on examination of the detailed description of an embodiment which is in no way limitative, and the attached drawings, in which:

FIG. 2 shows a summary of different operators and their respective action represented graphically:
  a) for a polynomial denoted U (a) that describes one of the magnetization components (longitudinal or transverse) in the form of configuration states the detail of which is described below, the index j is shown along horizontal lines along $Y^{-1}$, different k indexes being illustrated by different lines superimposed vertically along $Z^{-1}$.
  b) Convolution with the weighting polynomials $W_1$ or $W_2$ is equivalent to a point-by-point multiplication of the coefficients along $Z^{-1}$
  c) The multiplication by $Z^{-1}$ shifts the coefficients by one step in this direction, d) the conjugation operation corresponds to a central symmetry
e) The convolution with $S_{-y}$ tilts the different lines along $Y^{-1}$ and $Z^{-1}$ by a coefficient that varies linearly with k. Its action is represented with a limited range and, depending on the discretization along $Y^{-1}$, wrapping from one side to the other needs to be implemented. The iterative calculation is then performed by combining these basic operations.

FIG. 3 represents the transverse component of the magnetization $Q_n$ in terms of coefficients according to configuration states, for $\alpha=300$, TR/T1=TR/T2=0.05 and $E_d=0.995$ (a corresponds to n=1 with only one non-zero coefficient at the center), n=4 (b); n=8 (c), n=16 (d), steady state (e). Progressively, the $N_{y=180}$ (index j, along $Y^{-1}$), $N_z=128$ (index k, along Z) plane is filled with non-zero coefficients that tend to the steady-state. For comparison, steady-state without diffusion (f) displays much more non-zero coefficients exemplifying the attenuating effects of diffusion (by comparison with e).

FIG. 8 shows different multiparametric images: maps of M (a), of the flip angle (b in °), of R$_1$ (c in s$^{-1}$), of R$_2$ (d in s$^{-1}$) and of the diffusion coefficient (e in 10$^{-9}$ m$^2$s$^{-1}$) obtained for 45° with the sequence 1 processed with the proposed inverse problem.

FIG. 9 shows the mean longitudinal and transverse relaxivities estimated over the tubes for Gd (a) and ION (b) are plotted together with their associated standard deviations. Molar relaxivities are estimated by fitting the relaxivities with a line as a function of the concentration (equation is provided on the graph, C stands for the concentration in mM). The relaxivities are linear as a function of the concentration, demonstrating a reliable measurement of R1 and R2 over a wide range of values.

FIG. 11 shows the sequence containing the RF pulse repeated every TR with magnetic field gradient area A remaining between the repetitions in an encoding direction and inserted into a gradient-echo sequence. The logical axes of imaging gradients Gx for readout, Gy for a first phase encoding direction and Gz for the slice selection and any additional phase encoding are shown. All these imaging gradients have a zero area between each repetition. The encoding direction can be applied in any direction Gx, Gy or Gz as well as in an oblique direction, which naturally leads to an optimization of the combination of the gradients resulting therefrom. Different variants are show in order to illustrate the type of acquisition that is possible: variant a consists of acquisition of order 0 only; variant b consists of acquisition of order k only; variant c consists of acquisition of 3 orders during one and the same repetition.

DETAILED DESCRIPTION

Figure 1:
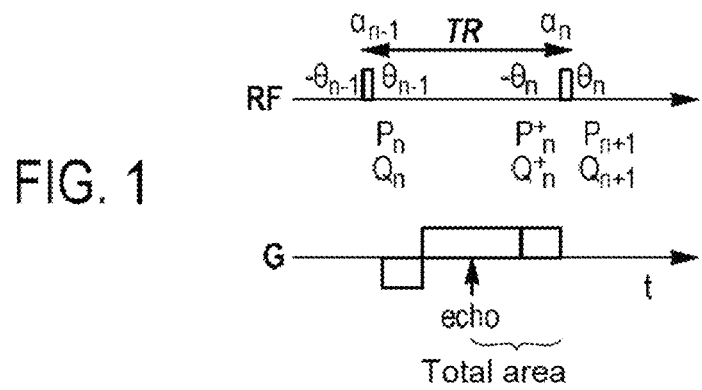
FIG. 1 shows diagrammatically for a first embodiment of the method according to the invention, the sequence of RF pulses repeated every TR (n is the repetition number) amplitude- ($\alpha_n$) and phase-modulated ($\theta_n$). The longitudinal ($P_n$) and transverse ($Q_n$) components of magnetization after pulse number n−1 changes up to $P_n^+$ and $Q_n^+$ just before pulse number n. The gradient waveform (G) is shown here in the readout direction, which leaves a non-zero gradient area between each repetition.

As these embodiments are in no way limitative, variants of the invention can be considered comprising only a selection of the characteristics described or shown hereinafter, in isolation from the other characteristics described or shown (even if this selection is isolated within a phrase containing other characteristics), if this selection of characteristics is sufficient to confer a technical advantage or to differentiate the invention with respect to the state of the art. This selection comprises at least one, preferably functional, characteristic without structural details, and/or with only a part of the structural details if this part alone is sufficient to confer a technical advantage or to differentiate the invention with respect to the state of the prior art.

The reference numbers in brackets hereinafter will be the bibliographic reference numbers listed at the end of the present description, and the reference numbers without brackets will be the numerical reference numbers of the figures.

Despite the relatively simple dependence with respect to $T_1$ and to the flip angle of the Ernst equilibrium applicable when the transverse magnetization is completely eliminated between two identical radiofrequency (RF) pulses (1), the development of rapid imaging sequences at the beginning of the MRI rapidly showed that it was essential to take account of the recycling of the transverse magnetization component after repeated excitations. The steady-state free precession (SSFP) sequences were proposed as an effective means of combining a good signal-to-noise ratio (SNR), and obtain contrasts of mixed proton density $T_1$ and $T_2$ contrasts (2). Rapidly, the RF phase cycling spoiling that uses quadratic phase cycling from one excitation to another combined with a non-zero gradient area between pulses, was proposed in order to efficiently limit the formation of transverse magnetization coherences (3-5). Theoretical and practical descriptions were then introduced for analyzing the action of repeated pulses on the magnetization. These tools are based on the configuration states formalism applied to the longitudinal and transverse magnetization components which are then decomposed into a discrete Fourier series, as is the case in the extended phase graph (6-9), or also through polynomial decomposition linking RF pulse design to digital filtering (10,11).

Due to the mixing of the longitudinal and transverse components, whether on the transient signal (11-14) or on the steady state (SSFP), the magnetization depends in a complex manner on the physical parameters (such as the relaxation time and the diffusion coefficient) and on the sequence parameters (flip angle, amplitudes and RF pulse phases, repetition time and repetition index, shape and total area of gradients). A wide range of sensitization can be obtained and parameters extracted from this type of sequences of repeated pulses. In particular, the steady state was widely exploited. On the one hand, assuming a perfect spoiling (approximately obtained with quadratic phase cycling with increments of 117°, or other values (4,15,16)), sequential acquisitions with different angles (variable flip angles) makes it possible to map $T_1$ and/or the flip angle (15-21). On the other hand, without phase spoiling, acquisitions of multiple configuration states k (22) can be used in order to characterize the transverse relaxation (23-26). With reference to the diffusion sensitivity, which is, like the transverse relaxation, an irreversible mechanism that limits the formation of stimulated echoes, its influence on the SSFP steady states without phase cycling was processed using the configuration states formalism in spectroscopy (27), before being applied to imaging (28-31) up to the use of multiple configuration states k in order to allow mapping of the diffusion coefficient (24,32). Between the extreme cases of the absence of spoiling without phase cycling and perfect spoiling eliminating all transverse magnetization, the partial spoiling using a low-value quadratic-phase increment around 0° was proposed in order to quantify the transverse relaxation (33-35).

It is proposed, within the framework of the present description of certain embodiments and variants according to the invention, to unify these different approaches by extending the configuration states formalism to the RF phase cycling. By using this extended formalism, an algorithm is proposed for calculating the magnetization after any repeated amplitude and phase pulses whatsoever, including the effects of relaxation and diffusion. Within the framework of this description, the components associated with each configuration state are real numbers and the action of the RF pulses (amplitude- and phase-modulated) is reduced to digital operations of linear filtering, linear combinations and index shifting, operations that have a simple graphical representation. It is deduced that any periodic amplitude and apparent frequency sweep rate makes it possible to obtain interleaved steady states, which opens the possibility of extending the capabilities for sensitizing the signal to the physical and sequence parameters. For the particular case of constant angle amplitude with RF quadratic phase cycling (equivalent to a constant apparent frequency sweep rate), the SSFP signal can be calculated taking account of the relaxation and diffusion in a very efficient manner. Finally, based on the acquisition of multiple amplitude series and phase cycling schemes, an inverse problem is proposed to reconstruct maps of the underlying parameters. The theory, practical implementation as well as proof-of-concept experiments on a clinical appliance is given by introducing new methods for multiparametric mapping based on acquisitions with rapid sequences including repeated RF pulses.

Hereinafter, a description will be given of the magnetization after repeated application of interleaved radiofrequency pulses (RF), amplitude- and phase-modulated, with a constant gradient area, in order to then derive a generic inverse problem for the multi-parametric imaging allowing the quantification of the nuclear magnetization, the flip angle, the longitudinal and transverse relaxation rates and the diffusion coefficient.

As will be seen hereinafter, the configuration states formalism, which takes account of the dephasing due to the gradient (through k orders), is extended within the framework of the present description of certain embodiments and variants of the invention to include the RF pulse phase modulation (j orders). The action of the repeated pulses is reduced to filtering operations and has a simple graphical representation. Manipulation of the contrast in the steady-state free precession sequences (SSFP) is extended to the case of interleaved steady states. A least-square minimization algorithm is proposed for mapping multiple parameters based on the acquisition of states of order k=0. Contrast agent solutions are imaged with 3D sequences applying multiple RF pulses validating the proposed direct and inverse problems. A rapid calculation of the magnetization states after repeated pulses is obtained, both in the standard case of quadratic phase cycling at constant pulse amplitude and in more complex cases. The calculation is in perfect agreement with the experiments and the resolution of the inverse problem gives access to the nuclear magnetization, to the angle, to the relaxation rate and to the diffusion coefficient. Thus, by a simplification of the description of the magnetization after repeated phase- and amplitude-modulated pulses, the possibilities are extended for manipulation of the contrast in this type of sequences and demonstrates that the multiple parameters of interest in MRI can be extracted by this means.

First Embodiment of a Method and a Device According to the Invention

Figure 10:
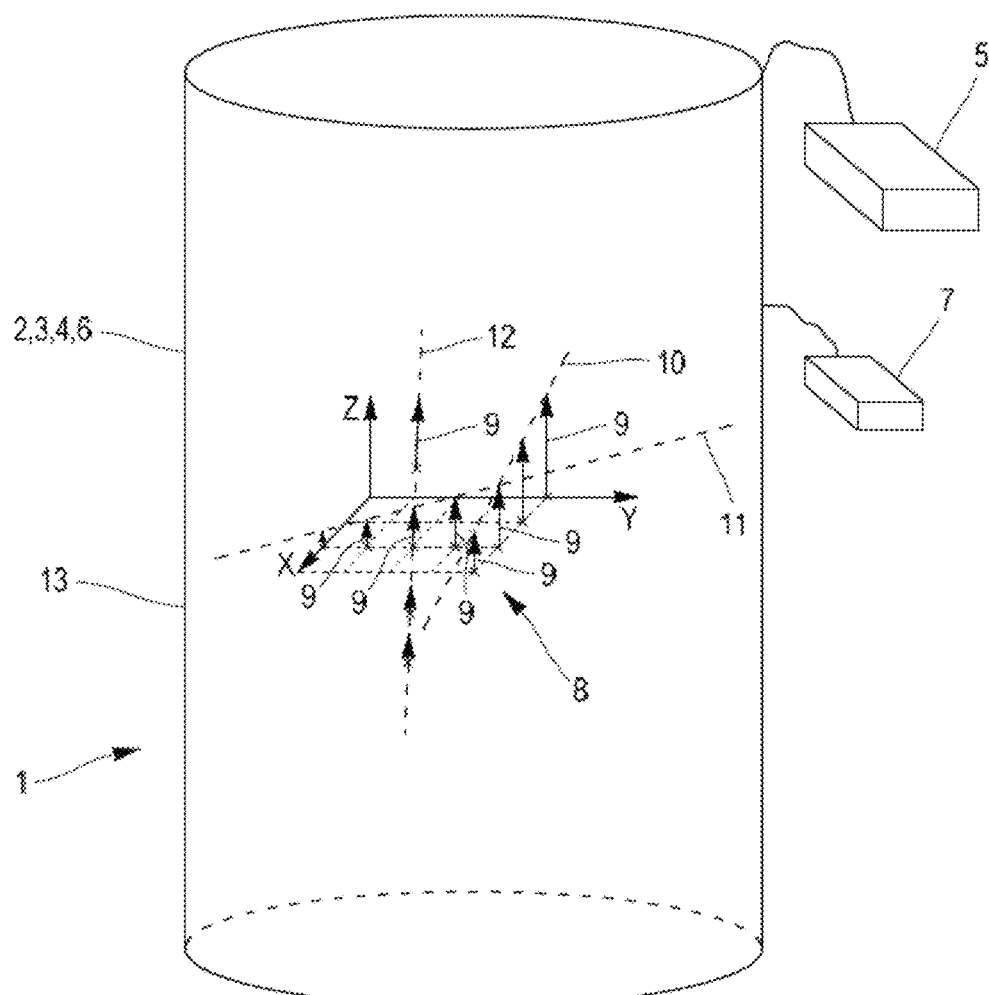
FIG. 10 is a diagrammatic view of a first embodiment of a device according to the invention.
Figure 4A:
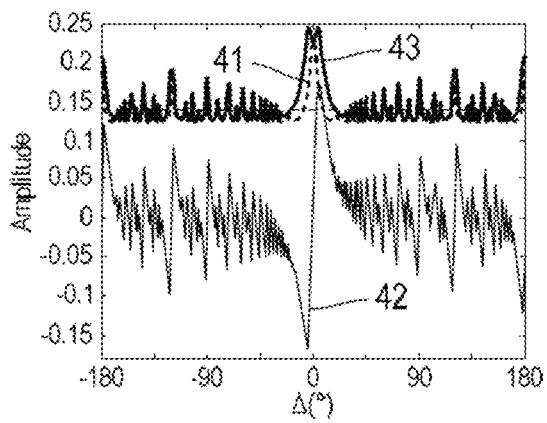
FIG. 4 shows a simulation result of the effect of T2 and diffusion over transverse magnetization at the steady state for the order k=0 and for $\Delta$ comprised between −180° and 180° with a constant $u_n=1$ series as well as a constant amplitude. The transverse magnetization is visualized after Fourier transform along $Y^{-1}$: real component (line referenced 41), imaginary component (line referenced 42) and absolute value (line referenced 43) for $\alpha=30°$, TR/T1=0.05 and $N_y=720$. The Ernst equilibrium is shown with the black dashed line. Several cases are shown: magnetization without diffusion and with TR/T$_2$=0.05 (a), without diffusion and with TR/T$_2$=0.25 (b), with limited diffusion ($E_d=0.995$, which corresponds to b=2.39 s·mm$^{-2}$ if D=2.1 10$^{-9}$ m$^2$·s$^{-1}$) and TR/T$_2$=0.05 (c), with stronger diffusion ($E_d=0.95$, which corresponds to b=24.4 s·mm$^{-2}$ if D=2.1 10$^{-9}$ m$^2$·s$^{-1}$) and TR/T$_2$=0.05 (d). The transverse relaxation T$_2$ and the diffusion tends to smooth the magnetization profile as a function of $\Delta$, limiting stimulated echoes formation. The steady states take values smaller and larger than the Ernst equilibrium, which is never reached exactly.
Figure 4B:
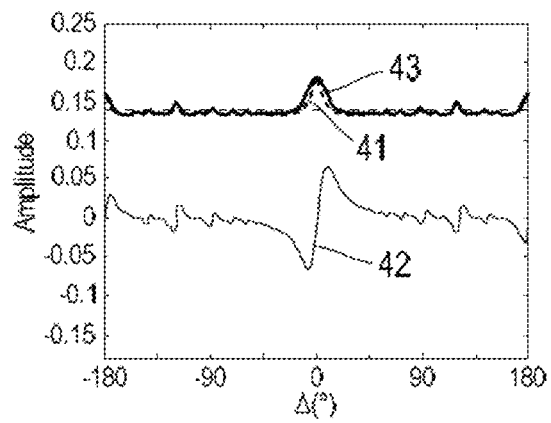
Figure 4C:
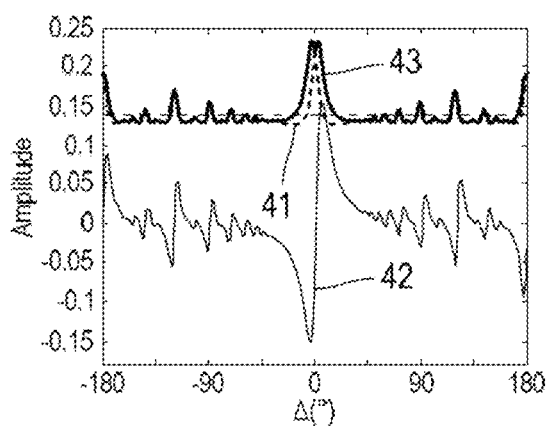
Figure 4D:
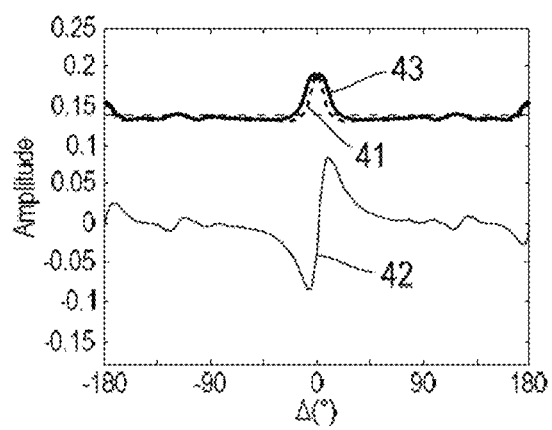
Figure 5A:
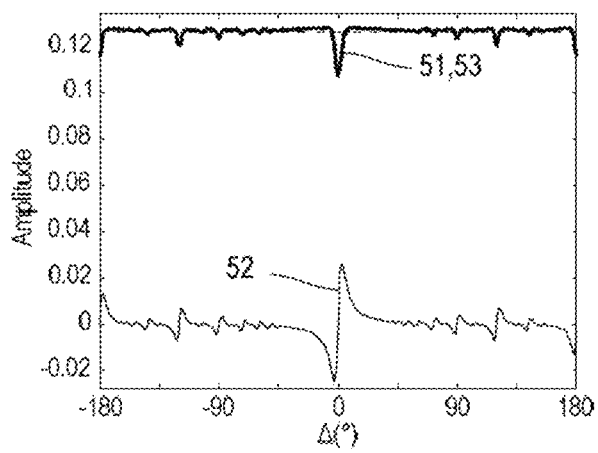
FIG. 5 shows a result of simulation of the effect of flip angle over magnetization at the steady state for k=0 with quadratic phase cycling (series $u_n=1$ constant, amplitude constant). The transverse magnetization $Q_0$ (a, c, e) is visualized after a Fourier transform along $Y^{-1}$: real component (line referenced 51), imaginary component (line referenced 52) and absolute value (line referenced 53) for TR/T$_1$=TR/T$_2$=0.05, $E_d=0.995$ and $N_y=720$. The Ernst equilibrium is shown with the black dashed line. The results for different flip angles are presented from top to bottom: for $\alpha=9°$ (a), for the Ernst angle $\alpha=18°$ (c), and for $\alpha=75°$ (e). The right-hand column showing the longitudinal and transverse components in 3D (b, d, f) for the angles corresponding to (a, c, e). The magnetization is contained in a plane that passes through the Ernst equilibrium and that is oriented with an effective angle $\alpha_{eff}$ with respect to B$_0$ and such that $\tan(\alpha_{eff})=(E_1-c)/s$. When A varies, the magnetization rotates in this plane about the Ernst equilibrium.
Figure 5B:
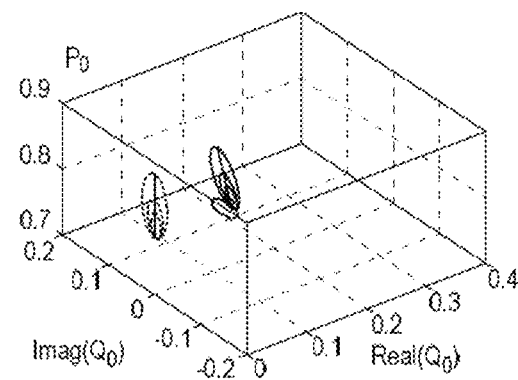
Figure 5C:
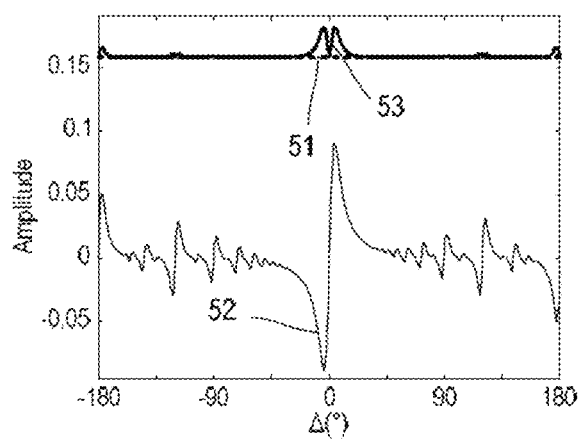
Figure 5D:
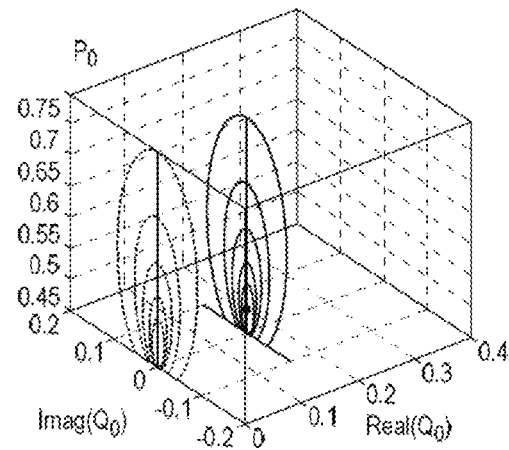
Figure 5E:
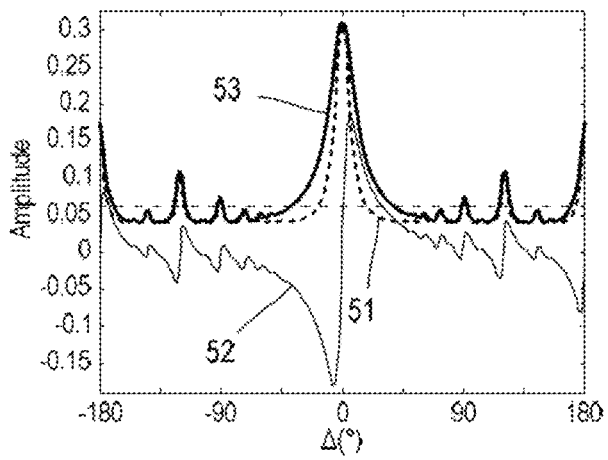
Figure 5F:
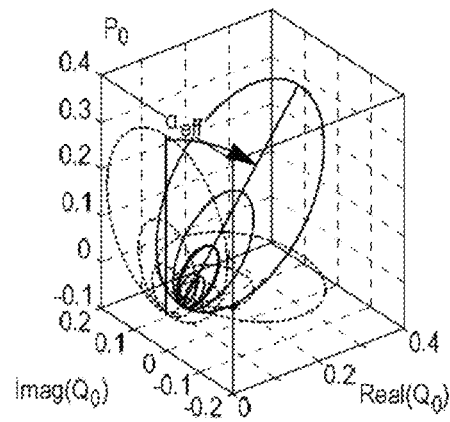

With reference to FIG. 10, the first embodiment of device 1 according to the invention comprises:
- means 2 for continuous application of a main magnetic field $B_0$ along a Z-axis on a sample area (comprising for example a permanent magnet or a superconductive coil or a solenoid such as is found in an MRI machine)
- means 3 for transmitting a magnetic field gradient (comprising for example three conductive coils or a solenoid such as is found in an MRI machine),
- means 4 for transmitting a radiofrequency pulse (comprising for example a radiofrequency antenna called "body" such as is found in an MRI machine),
- control means 5 arranged in order to control the means for transmitting a magnetic field gradient and the means for transmitting a radiofrequency pulse,
- means 6 for acquiring at least one nuclear magnetic resonance signal (comprising for example several receiver antennas mounted in a phased array such as is found in an MRI machine), calculation means 7.

The different means 2, 3, 4, 6 are typically in the walls of an enclosure 13 (typically cylindrical in shape, typically with internal dimensions: diameter=60 cm; length=2 meters) for clinical systems inside which are located the sample area 8, and which are not shown in detail in FIG. 10.

Each of the steps of the method according to the invention is not carried out in a purely abstract or purely intellectual manner but involves the utilization of a technical means.

Each of the control means 5, the acquisition means 6 and the calculation means 7 comprises a computer, and/or a central processing or calculation unit, and/or an analogue electronic circuit (preferably dedicated), and/or a digital electronic circuit (preferably dedicated) and/or a microprocessor (preferably dedicated), and/or software means.

As will be seen hereinafter, each of the control means 5, the acquisition means 6 and the calculation means 7 can be arranged, (for example by comprising a dedicated electronic card) and/or more specifically programmed (for example by comprising software means), in order to carry out certain functions or operations or control or calculation etc.

With reference to FIGS. 1, 10 and 11, first embodiment of a method for magnetic resonance imaging implemented by the first embodiment of the device according to the invention, comprises:
- continuous application (by the means 2) of the main magnetic field $B_0$ (homogeneous in the entire sample zone 8) along the Z-axis on a sample arranged in the sample area (hereinafter, both the term "sample" and the expression "sample area" will be used interchangeably, in respect of for example a field transmitted into the sample and transmitted into the sample area, and vice-versa), and
- at least one set of repeated applications, (by the control means 5 that are arranged or programmed in order to perform this at least one set of repeated applications), on the sample and according to a period TR, of a sequence (of the "unbalanced" type), said sequence comprising:
  - a radiofrequency pulse RF optionally of variable amplitude $B_1$ and/or variable phase at each repetition, and after the radiofrequency pulse of the sequence, a spatial gradient of the component along the Z-axis of the magnetic field; typically, the spatial gradient of the component $B_z(x, y, z)$ along Z of the magnetic field at the point of coordinates (x, y, z) varies in three orthogonal directions (for example X, Y, Z); this gradient can thus typically be decomposed into the form $$\left( \frac{dB_z(x, y, z)}{dx}; \frac{dB_z(x, y, z)}{dy}; \frac{dB_z(x, y, z)}{dz} \right)$$

and this gradient corresponds typically to the sum:
i) of an encoding gradient Gencoding in an encoding direction such as introduced hereinafter, this Gencoding gradient has a non-zero temporal integral (over time TR) between each repetition of the sequence.
ii) of a readout gradient Greadout (for example at Gx along the X-axis in FIG. 11); this readout gradient has a zero temporal integral (over time TR) between each repetition of the sequence.
iii) of a phase encoding gradient Gphase1 (for example equal to Gy along the Y-axis in FIG. 11); this readout gradient has a zero temporal integral (over time TR) between each repetition of the sequence.
iv) of a slice selection encoding gradient Gslice optionally combined with a second phase encoding gradient Gphase2 (the combination of which is for example equal to Gz along the Z-axis in FIG. 11); these section selection and phase encoding gradients have a zero temporal integral (over time TR) between each repetition of the sequence.

the readout, phase encoding and slice selection gradients described in points ii) iii) and iv) being defined along three distinct orthogonal axes; the utilization of the readout, phase encoding and slice selection gradients described in points ii) iii) and iv) are known in the state of the art and will therefore not be detailed further.

By "continuous application" of $B_0$ is meant in the present description an application of constant value in the time $B_0$ throughout the entire duration of at least one set of repeated applications of the sequence.

As can be seen in FIG. 10, the magnetic field 9 is parallel to the Z-axis in the entire sample area 8. The spatial gradient $$\frac{dB_z(x, y, z)}{dx}$$

of the component according to Z of the magnetic field along the X-axis is shown by the line 10. The spatial gradient $$\frac{dB_z(x, y, z)}{dy}$$

of the component according to Z of the magnetic field along the X-axis is shown by the line 11. The line 12 does not show a slope or a gradient, but along this line 12 different values can be seen of the component according to Z of the magnetic field which give a good illustration of the spatial gradient $$\frac{dB_z(x, y, z)}{dz}$$

of the component according to Z of the magnetic field along the Z-axis.

During repeated applications of the radiofrequency pulse and of the magnetic field spatial gradient of the sequence of one and the same set (the control means 5 being arranged or programmed for this):

the radiofrequency pulse follows, between its different repeated applications, a periodic series:
for its amplitude, and
for $u_{n+1}=v_{n+1}-v_n$, where n is an integer greater than or equal to 1 representing the repetition number of the sequence for this set, and where $u_{n+1}$ is a relative integer series making it possible to define the series $v_n$ to a nearest arbitrary constant $v_1$ such that $\varphi_n=v_n\times\Delta$ and $\varphi_n=\theta_n-\theta_{n-1}$ with $\Delta$ which is a constant real number for all of the repeated applications of the sequence of this set and $\varphi_n$ which is the increment between the phase $\theta_n$ of the radiofrequency pulse at its $n^{th}$ repartition in this set and the phase $\theta_{n-1}$ of the radiofrequency pulse at its $(n-1)^{th}$ repartition in this set, with $\theta_0$ an arbitrary value, and each repeated application of the magnetic field spatial gradient of the sequence has, in a spatial gradient direction called encoding direction identical for each gradient application of this set, a non-zero temporal integral equal to A (over the time TR) and identical for each gradient application of this set; the gradient in the encoding direction is, at each given time t, preferably the same for all the points of the sample; the gradient in the encoding direction also preferably has an identical shape for each gradient application of this set; the encoding direction can be in the direction of the X-, Y- or Z-axis, or any direction oblique to these axes: the case in FIG. 1 corresponds to the particular case in which the encoding direction is parallel to the X-axis of the readout gradient Greadout=Gx, and the reference G in FIG. 1 is thus equal to the sum:

Greadout+Gencoding=Gx+Gencoding.

The first embodiment of the method according to the invention implemented by the first embodiment of the device according to the invention also comprises acquisition (by the acquisition means 6 which are arranged or programmed for this), during at least one of the repetitions of the sequence, of at least one nuclear magnetic resonance signal (at an echo time TE (less than TR) between an application of the RF pulse and the acquisition), preferably corresponding to at least one coherence order obtained during the application, for this at least one sequence repetition, of the magnetic field spatial gradient in the encoding direction reaches a multiple temporal integral (by a relative integer) of A (such as order 0 (corresponding to 0*A), order −1 (corresponding to −1*A), order 1 (corresponding to 1−*A), or multiples of higher order), preferably to the coherence order equal to zero. Different variants are shown in FIG. 11: the variant a consists of acquisition of order 0 only, the variant b consists of acquisition of order k only; the variant c consists of acquisition of 3 orders during one and the same repetition.

According to the variant of the invention considered, during repeated applications of the radiofrequency pulse and of the magnetic field spatial gradient of the sequence of one and the same set (the control means 5 being arranged or programmed for this):

the series $u_{n+1}=v_{+1}-v_n$ is a non-constant periodic series, and/or the amplitude of the radiofrequency pulse follows a non-constant periodic series, If the series $u_{n+1}=v_{n+1}-v_n$ is not constant, it has a period $N_u$ which is a natural integer:
greater than 1,
The case $N_u=1$ is the case of the constant series.
An example of series $u_{n+1}=v_{n+1}-v_n$ with $N_u=3$ is for example:
for n=1, $u_1$ is equal to a first value,
for n=2, $u_2$ is equal to a second value,
for n=3, $u_3$ is equal to a third value,
for n=4, $u_4$ is equal to the first value $u_1$,
for n=5, $u_5$ is equal to the second value $u_2$,
for n=6, $u_6$ is equal to the third value $u_3$,
etc.

If the series of the amplitude of the radiofrequency pulse is not constant, it has a period $N_a$ which is a natural integer:
greater than 1,
The case $N_a=1$ is the case of the constant series.
An example of series of the amplitude of the radiofrequency pulse with $N_a=3$ is for example:
for n=1, the amplitude of the radiofrequency pulse is equal to a first value,
for n=2, the amplitude of the radiofrequency pulse is equal to a second value,
for n=3, the amplitude of the radiofrequency pulse is equal to a third value,
for n=4, the amplitude of the radiofrequency pulse is equal to the first value,
for n=5, the amplitude of the radiofrequency pulse is equal to the second value,
for n=6, the amplitude of the radiofrequency pulse is equal to the third value,
etc.

In the first embodiment of the method according to the invention implemented by the first embodiment of the device according to the invention, the nuclear magnetic resonance signal is acquired at at least one dynamic steady state of magnetization of the sample, the control means 5 being arranged or programmed in order to control the acquisition means 6 to perform such an acquisition. According to the variant of the invention considered:

1) during repeated applications of the radiofrequency pulse and of the magnetic field spatial gradient of the sequence of one and the same set (the control means 5 being arranged or programmed for this):
   the series $u_{n+1}=v_{n+1}-v_n$ is a non-constant periodic series, and/or
   the amplitude of the radiofrequency pulse follows a non-constant periodic series, so as to obtain different interleaved steady states of magnetization of the sample within this set respectively for different periodic values of the series $u_{n+1}=v_{n+1}-v_n$ and/or the amplitude of the radiofrequency pulse, and the nuclear magnetic resonance signal is acquired at these different interleaved steady states, the control means 5 also being arranged or programmed in order to control the acquisition means 6 in order to perform such an acquisition, and/or 2) several sets (one or more of which can be of the type of set in paragraph 1) of the present section), with (the control means 5 being arranged or programmed for this):
   $\Delta$ the value of which differs between the different sets, and/or the amplitude of the radiofrequency pulse that follows a periodic series (constant or not) that differs between the different sets, so as to obtain different sequential steady states of the magnetization in the sample that are sequential for different values of Δ and/or of the amplitude including at least one steady state per set, and the nuclear magnetic resonance signal is acquired at these different sequential steady states, the control means 5 also being arranged or programmed in order to control the acquisition means 6 in order to perform such an acquisition.

Within each set of repeated sequence applications, the number of iterations of the sequence needed in order to reach a magnetization very close to the dynamic steady state is of the order of $$5\frac{T1}{TR}.$$

As T1 is not known beforehand, it is possible to assume typically a value of T1 target (for example of the order of 1 second), and repetitions must then be applied during at least a period of time for establishing a steady state of the order of 5*T1 target, thus ensuring that the dynamic steady state is reached for all the samples having a smaller T1. The acquisition and storage of the data will preferably not start until after this establishment time. However, the acquisition may be triggered before this establishment time, i.e. during the transient phase:

either by acquiring high spatial frequencies during the phase of establishing a steady state while ensuring that the central spatial frequencies (in particular the center of the Fourier plane) are acquired at or after, this steady-state establishment time, Or, in particular in order to refine the quantification in the variant called "multi-parametric imaging" by including the modelling of the transient state during the phase of establishing a steady state.

Particular Case of the Decomposition of the Magnetization into Two-Dimensional Configuration States The action of repeated RF pulses spaced out over a time TR is considered here (FIG. 1). As in most of the SSFP sequences, a gradient is applied which produces a spatial shift between the pulses characterized by a spatial frequency:

$$\Delta k_z = 1/a = \frac{\gamma}{2\pi} \int_0^{TR} G(t)dt, \quad (1)$$

Where γ is the gyromagnetic ratio, a is a characteristic distance corresponding to the inverse of a spatial frequency $\Delta k_z$ and G(t) is the gradient waveform. Without loss of generality, the net dephasing is represented in an arbitrary direction that will be denoted z. The variable $Z=\exp(-i2\pi\Delta k_z z)$ represents the resulting spatial modulation between two excitations, characterized by the total area of the gradients between the RF pulses. In order to describe the magnetization in such repeated sequences, configuration states formalism in 1D can be used, in which the longitudinal and transverse components are decomposed in polynomials in $Z^{-1}$. These polynomials will be denoted P and Q respectively for the longitudinal and transverse components. This formalism was proposed in multiple studies, either without RF phase modulation (9,10,24,27,29-31), or directly, including it in an extended n phase-graph approach or by using analytical solutions (8,33). The RF phase increment between the excitation n and the excitation n−1 will be denoted $\varphi_n = \theta_n - \theta_{n-1}$. This increment between to TRs makes it possible to define an apparent instantaneous frequency $\varphi_n/2\pi TR$. It will be assumed here that the phase increment is a multiple of a phase Δ, such that $\varphi_n = v_n \times \Delta$, where $v_n$ is an arbitrary integer sequence. This makes it possible to introduce the variable $\gamma = \exp(-i\Delta)$. In order to simplify the expressions, it can be assumed that the transverse components is demodulated by using the preceding RF pulse phase (the frame of reference rotating at the transmission frequency (4)). In a similar manner to the configuration states formalism (8,9,27), the magnetization can thus be decomposed as a 2D series in $Y^{-1}$ and $Z^{-1}$:

$$P_n = \sum_{k=-\infty}^{k=\infty} \sum_{j=-\infty}^{j=\infty} p_{j,k,n} Y^{-j} Z^{-k} \quad (2)$$

$$Q_n = \sum_{k=-\infty}^{k=\infty} \sum_{j=-\infty}^{j=\infty} q_{j,k,n} Y^{-j} Z^{-k}.$$

Effects of Relaxation, Diffusion and Flip Angle

In a recent journal article (9), it was stated that the relaxation and diffusion can be accounted for by the convolution operations in the spatial domain with suitable filters. This convolution is equivalent to the point-by-point multiplication of the coefficients of the polynomial series along the $Z^{-1}$ direction. In order to keep the derivation as general as possible, the evolution in the longitudinal and transverse components between two pulses will be synthesized using weighting polynomial in $Z^{-1}$.

$$W_1 = \sum_{k=-\infty}^{k=\infty} w_{1,k} Z^{-k} \quad (3)$$

$$W_2 = \sum_{k=-\infty}^{k=\infty} w_{2,k} Z^{-k}.$$

For simplicity, the relaxation and the free diffusion will be assumed here for which the coefficients of the longitudinal $W_1$ and transverse $W_2$ magnetization weighting polynomials are real, producing an attenuation of the coefficients, respectively, of P and Q. The extension to other types of weighting is discussed below. The following variables are introduced in order to take account of the free relaxation and diffusion: $E_1 = \exp(-TR/T_T)$, $E_2 = \exp(-TR/T)$, $E_d = \exp(-D \times TR \times (2\pi/a)^2) = \exp(-b \times D)$. The variables $E_1$ and $E_2$ correspond to the attenuation resulting from the longitudinal and transverse relaxation respectively, between the two pulses. The variable $E_d$ is an attenuation resulting from the free diffusion, where D is the free diffusion coefficient, and where b is defined as $b=TR \times (2\pi/a)^2$. In appendix 1, the two polynomials $W_1$ and $W_2$ are expressed as a function of $E_1$, $E_2$ and $E_d$. As reported in (27) and in Appendix 1, $W_1$ is a symmetric Gaussian filter ($w_{1,k}=w_{1,-k}$) while $W_2$ depends on the exact gradient waveform, which makes it possible to selectively attenuate different configuration states according to $Z^{-1}$. The evolution in the longitudinal component $P_n$ just after RF pulse number n−1 to $P_n^+$ just before pulse number n is given by:

$$P_n^+ = 1 - E_1 + W_1 * P_n, \quad (4)$$

expression in which the longitudinal recovery and the diffusion weighting are taken into account. The notation * represents the convolution operation, calculated as the multiplication of $p_{j,k,n}$ by the weighting coefficients $w_{1,k}$ for all j and k. The transverse magnetization component evolves as $$Q_n^+ = Y^{-v_n} Z^{-1}(W_2 * Q_n). \tag{5}$$

Indeed, the coefficients of the transverse components are attenuated (convolution with $W_2$), and an additional dephasing is taken into account spatial dephasing resulting from the non-zero gradient area (multiplication by $Z^{-1}$) and by placing the magnetization along an axis ready to be flipped using the following RF pulse ($Y^{-v_n}$). The real and imaginary parts of $Q_n^+$ are:

$$R_n = \tfrac{1}{2}(Q_n^+ + \overline{Q_n^+})$$

$$I_n = \tfrac{1}{2}(Q_n^+ - \overline{Q_n^+}), \tag{6}$$

expression in which the bar represents the complex conjugate. As the demodulation was performed with respect to the RF pulse phase, only the real part of the transverse component is affected by the next RF pulse. After RF pulse number n, the magnetization is flipped by an angle $\alpha_n$ with respect to the frame of reference of the RF. This is reflected in the polynomials as:

$$P_{n+1} = c_n(1 - E_1 + W_1 * P_n) - s_n R_n$$

$$Q_{n+1} = s_n(1 - E_1 + W_1 * P_n) + c_n R_n + I_n. \tag{7}$$

where $c_n = \cos(\alpha_n)$ and $s_n = \sin(\alpha_n)$. In this 2D configuration states description, starting from thermal equilibrium for which $P_0 = 1$ and $Q_0 = 0$, it can be easily shown by recurrence that the coefficients $P_{j,k,n}$ and $q_{j,k,n}$ are real numbers, which simplifies the iterative calculation of the coefficients of the polynomials. However, the equation Eq. 7 makes the recurrence relation difficult to analyze.

Simplification of the Recurrence Using the Apparent Frequency Sweep Rate

In order to take account of the RF phase cycling and to simplify the recurrence relationship, an operator can be introduced, based on the following polynomial:

$$S_v = \sum_{k=-\infty}^{k=\infty} Y^{-kv} Z^{-k}. \tag{8}$$

As shown in Appendix 2, this polynomial has properties of combinations $S_u * S_v = S_{u+v}$ and symmetry $\overline{S_v} = S_v$. Applied to U, representing an arbitrary polynomial in $Y^{-1}$ and $Z^{-1}$, the phase cycling effect can be simplified to $Y^{-v} Z^{-1}(S_v * U) = S_v * (Z^{-1} U)$. By exploiting these properties, the magnetization can be described as deconvoluted polynomials: $P_n^s = S_{-v_n} * P_n$, $Q_n^s = S_{-v_n} * Q_n$. This is equivalent to carrying out a demodulation of the magnetization with respect to the apparent instantaneous frequency. After introducing these expressions in the recurrence relationship, simplified expressions are obtained with respect to the RF phase cycling:

$$S_{u_{n+1}} * P_{n+1}^s = c_n(1 - E_1 + W_1 * P_n^s) - s_n R_n^s$$

$$S_{u_{n+1}} * Q_{n+1}^s = s_n(1 - E_1 + W_1 * P_n^s) + c_n R_n^s + I_n^s$$

$$R_n^s = \tfrac{1}{2}[Z^{-1}(W_2 * Q_n^s) + \overline{Z^{-1}(W_2 * Q_n^s)}]$$

$$I_n^s = \tfrac{1}{2}[Z^{-1}(W_2 * Q_n^s) - \overline{Z^{-1}(W_2 * Q_n^s)}] \tag{9}$$

in which $u_{n+1} = v_{n+1} - v_n$. As $v_n \times \Delta/2\pi TR$ represents an apparent instantaneous frequency, $u_{n+1} \times \Delta/2\pi TR^2$ represents an apparent frequency sweep rate between two TRs. In the general case of a modulation of both amplitude and phase, by combining the equation Eq. 9, the following is obtained:

$$S_{u_{n+1}} * (c_n Q_{n+1}^s - s_n P_{n+1}^s) = R_n^s + c_n I_n^s \tag{10}$$

Which makes it possible to express the longitudinal polynomial $P_n^s$ as a function of the transverse polynomial:

$$S_{u_n} * s_{n-1} P_n^s = S_{u_n} * c_{n-1} Q_n^s - R_{n-1}^s - c_{n-1} I_{n-1}^s, \tag{11}$$

and the recurrence relationship as a function of the transverse polynomial over three consecutive iterations:

$$s_{n-1} S_{u_{n+1}+u_n} * Q_{n+1}^s = s_{n-1} s_n(I - E_1) + S_{u_n} * (s_n c_{n-1} W_1 * Q_n^s + c_n R_n^s + I_n^s) - s_n W_1 * (R_{n-1}^s + c_{n-1} I_{n-1}^s) \tag{12}$$

This expression indicates that, instead of using $P_n$ and $Q_n$ in order to obtain $P_{n+1}$ et $Q_{n+1}$, it is possible simply to study the two transverse polynomials corresponding to the preceding iterations $Q_n$ et $Q_{n-1}$ in order to obtain $Q_{n+1}$, based on which $P_{n+1}$ can be deduced using the equation Eq. 11. As a function of the choice of the amplitude series $\alpha_n$, and the apparent frequency sweep rate summarized by the series $u_n$, the recurrence relationship can be tuned as required.

Steady States

The coefficients of the equation Eq. 12 do not depend on n if, and only if, the operator $S_{u_n}$ is constant as well as the angle amplitude (i.e. $c_n = c$ and $s_n = s$). In this case $u_{n+1} = v_{n+1} - v_n = 1$ is a solution that involves $v_n = n + v_0$ i.e. a linear evolution of the phase increment $\varphi_n = (n + v_0)\Delta$, leading to standard quadratic cycling for $\theta_n$. This is a discrete version, with associated aliasing effects, of a frequency-sweeping experiment with a constant sweep rate. The presence of $v_0$ is noted in passing, which is equivalent to a different center frequency of the RF pulse, thus indicating that this parameter is not determinant for reaching a steady state such that the RF pulses are assumed to be instantaneous. It is known from simulations and through attenuation effects that a steady state $Q_\infty^s$ is reached for which:

$$S_2 * Q_\infty^s = s(1 - E_1) + S_1 * (cW_1 * Q_\infty^s + cR_\infty^s + I_\infty^s) - W_1 * (R_\infty^s + cI_\infty^s) \tag{13}$$

A further advantage resulting from the discretization is the possibility of tuning the recurrence relation in order to achieve multiple interleaved steady states with periodic series $\alpha_n$ and $u_n$. For example, if the angle amplitude is alternated such that $\alpha_{2n} = \alpha$ and $\alpha_{2n+1} = \alpha'$ as well as the apparent frequency sweep rate with $u_{2n} = u$ and $u_{2n-1} = u'$, two steady states $Q_\infty^s$ and $Q_\infty^{s'}$ will be achieved such that $$s' S_{u+u'} * Q_\infty^{s'} = s'(1 - E_1) + S_u * (sc'W_1 * Q_\infty^s + cR_\infty^{s'} + I_\infty^{s'}) - sW_1 * (R_\infty^{s'} + c'I_\infty^{s'})$$

$$sS_{u+u'} * Q_\infty^s = ss'(1 - E_1) + S_{u'} * (s'cW_1 * Q_\infty^{s'} + c'R_\infty^s + I_\infty^s) - s'W_1 * (R_\infty^s + cI_\infty^s) \tag{14}$$

This periodization of the angle series makes it possible to sensitize the steady states differently as a function of the physical and sequence parameters in an interleaved manner, potentially making it possible to introduce quantification methods based on the interleaved steady states.

Graphical Representation and Implementation

In order to synthesize the action of the different operators involved, a graphical representation of index shifting can be used based on the 2D decomposition into configuration states defined using the $Y^{-1}$ et $Z^{-1}$ base functions. Based on the equation Eq. 9, it can be seen that the recurrence relation can be decomposed into elementary operations shown in FIG. 2. If a polynomial U (FIG. 2a) is considered, the action of the convolution with a weighting polynomial is equivalent to a point-by-point multiplication of all the coefficients having the same index k according to $Z^{-1}$ (FIG. 2b). The longitudinal relaxation to the thermal equilibrium state is also taken into account by adding the cosine and sine of $(1-E_1)$ at the center (j=0, k=0), respectively for P and Q. The multiplication by $Z^{-1}$ corresponds to an index shift (k→k+1, FIG. 2c), the complex conjugate is a central symmetry j→-j, k→-k (FIG. 2d, the coefficients are real). The convolution with $S_{-v}$ 'tilts' coefficients such that j→j-k·v (FIG. 2e).

In order to calculate the transient and steady signals for $N_y \times N_z$ configuration states and arbitrary amplitude and phase series, a recurrence calculation can be performed based on the equation Eq. 9 on 2D grids for $P_n^s$ et $Q_n^s$ with j∈[$-N_y/2+1$, $N_y/2$] and k∈[$-N_z/2+1$, $N_z/2$] initialized at thermal equilibrium ($P_0^s=1$, $Q_0^s=0$). In order to obtain the magnetization for order k effectively measured, a Fourier transform of $Q_n^s$ can be performed in the direction $Y^{-1}$, which directly provides the values for all the Δ increments. It is noted that discretization along $Y^{-1}$ (the fact of only taking $N_y$ steps) can be processed by implementing aliasing effects in the $S_v$ shifting operator. On the other hand, the limitation of the number of steps in the $Z^{-1}$ direction requires an estimation of when the coefficients of the different polynomials become negligible. In order to estimate this necessary step value $N_z$, the transverse relaxation and diffusion can be considered, because their action tends to attenuate the transverse component. When transferring states with the term $Z^{-1}(W_2^* Q_n^s)$, assuming k-0 with a transfer to state k+1, the attenuation of the coefficients is of the order of $E_2 E_d^{k^2}$, such that cumulated attenuation from order zero to k is of the order of $E_2^k E_d^{k^3/3}$. A limit to the cumulated attenuation $E_{lim,2}$ of the coefficients can then be defined, which makes it possible to estimate the order k which would produce this attenuation via the relaxation: $k_2=\ln(E_{lim,2})/\ln(E_2)$, or via the diffusion:

$$k_{diff} = \sqrt[3]{3\ln(E_{lim,2})/\ln(E_d)}$$

(rounded to the nearest integer). The minimum $N_z=2\times\min(k_2,k_{diff})$ thus provides an estimation of the order number to be considered in the calculation. If $k_{diff} > k_2$, this also implies a limited effect for the diffusion with respect to the transverse relaxation.

While applicable to series of arbitrary pulses, the case of periodic series makes it possible to reach a steady state. The calculation of this state requires a sufficient number of iterations $n_{eq}$. Assuming $T_1 > T_2$, the longitudinal relaxation appears as the limiting factor for reaching steady state. Similarly, defining a limit for the cumulated attenuation at $E_{lim,1}$ provides an order of magnitude of the number of repetitions necessary in order to reach the steady state $n_{eq}=\ln(E_{lim,1})/\ln(E_1)$. Numerically, a criterion such as the relative variation can be used in order to stop the iterative calculation. It will be noted that the particular case of the SSFP signal achieved with quadratic phase cycling and constant angle ($\alpha_n=\alpha$, $u_n=1$) can be calculated more efficiently. This aspect has been proposed elsewhere with relaxation (33). In order to take account of any weighting polynomials $W_1$ et $W_2$, in particular including diffusion, a similar derivation based on the formulation of a tridiagonal linear system is given in Appendix 3 for efficiently calculating the steady state with quadratic phase cycling and constant angle.

Off-Resonance and Constant Flow Effect

The proposed calculation method is preferably implemented with a resonance frequency that is exactly that of the RF excitation pulse. In practice, the static field $B_0$ is not perfectly homogeneous, which produces effects on the signal measured. The off-resonance effects, as well as the dephasing induced by the motion producing an additional phase modulation $\varphi_0=\gamma\Delta B_0 TR+\pi v/V_{enc}$, where $\Delta B_0$ represents field inhomogeneities or possibly the chemical shift, and where $V_{enc}$ represents the velocity encoding linked to the gradient waveform moment of order 1. Introducing the complex exponential $Z_0=\exp(-i\varphi_0)$, the action of this additional dephasing along $Z^{-1}$ in the 2D configuration state representation (9) is similarly expressed considering a dephased polynomial in $Y^{-1}$ and $(Z_0 Z)^{-1}$ for which all coefficients remain real as in the case previously considered. Between the end of the RF pulse and the echo time, the signal is attenuated by the effects of the apparent transverse relaxation $E_2^*=\exp(-TE/T_2^*)$ and dephased by a factor $Z_{TE}=\exp(\varphi_{TE})$ with $\varphi_{TE}=\varphi_1+\gamma\Delta B_0 TE+\varphi_v$ including an optional dephasing $\varphi_1$ between the transmission and the reception, the effects of the field inhomogeneity $B_0$ and optional flow encoding $\varphi_v$.

Variant of the First Embodiment of a Method and a Device According to the Invention: Multiparametric Imaging; Implementation of an Inverse Problem Based on the Acquisition of the k=0 State In a variant (called "multiparametric imaging" variant) of the first embodiment of the method according to the invention implemented by the first embodiment of the device according to the invention (and described only with respect to its differences or characteristics in relation to this first embodiment) the method according to the invention comprises:

acquisition of a signal (preferably for the coherence order equal to zero) for steady states corresponding to different amplitudes of the radiofrequency pulses and/or different values of Δ and/or different values of the periodic series $u_{n+1}=v_{n+1}-v_n$, constant or not, the control means 5 being arranged or programmed in order to control the acquisition means 6 in order to perform such an acquisition, and for at least one point in the sample, determining (by calculation means 7, which are arranged or programmed for this) several data items (preferably at least 3, preferably all) from a nuclear magnetization, a magnetization flip angle, a diffusion coefficient, a longitudinal relaxation rate or time R1 or T1, and a transverse relaxation rate or time R2 or T2, based on the signal acquired for these steady states.

As will be seen in greater detail hereinafter, the determination is preferably performed (by calculation means 7, which are arranged or programmed for this), either by comparison with a pre-calculated dictionary, or by iterative estimation, according to a minimization of a norm of the difference between the acquired signal expressed in complex form with a real part and an imaginary part, and a model of the signal expressed in complex form with a real part and an imaginary part. In the example, the minimization comprises a least-square minimization algorithm, preferably using the Gauss-Newton algorithm applied to non-linear problems.

For this multiparametric imaging variant, in the case in which sequential steady states are exploited as previously described with several sets of sequence applications. In this case, this multiparametric imaging variant comprises an acquisition of a signal (preferably for the coherence order equal to zero) for steady states (preferably with a constant series $u_{n+1}=v_{n+1}-v_n$ for each set) corresponding to the different values of Δ (the control means 5 being arranged or programmed in order to control the acquisition means 6 in order to perform such an acquisition), including

- several points, for an absolute value of Δ close to 0°, between Δ=0° inclusive and Δ=32° inclusive modulo 360, and/or
- several points, for an absolute value of Δ close to 180°, between Δ=164° inclusive and Δ=196° inclusive modulo 360°, and/or
- several points, for an absolute value of Δ close to 120°, between Δ=112° inclusive and Δ=128° inclusive modulo 360°, and/or
- several points for an absolute value of Δ from 45°, 60°, 72°, 90°, and 144° modulo 360°. for a total of preferably at least five points.

Figure 6:
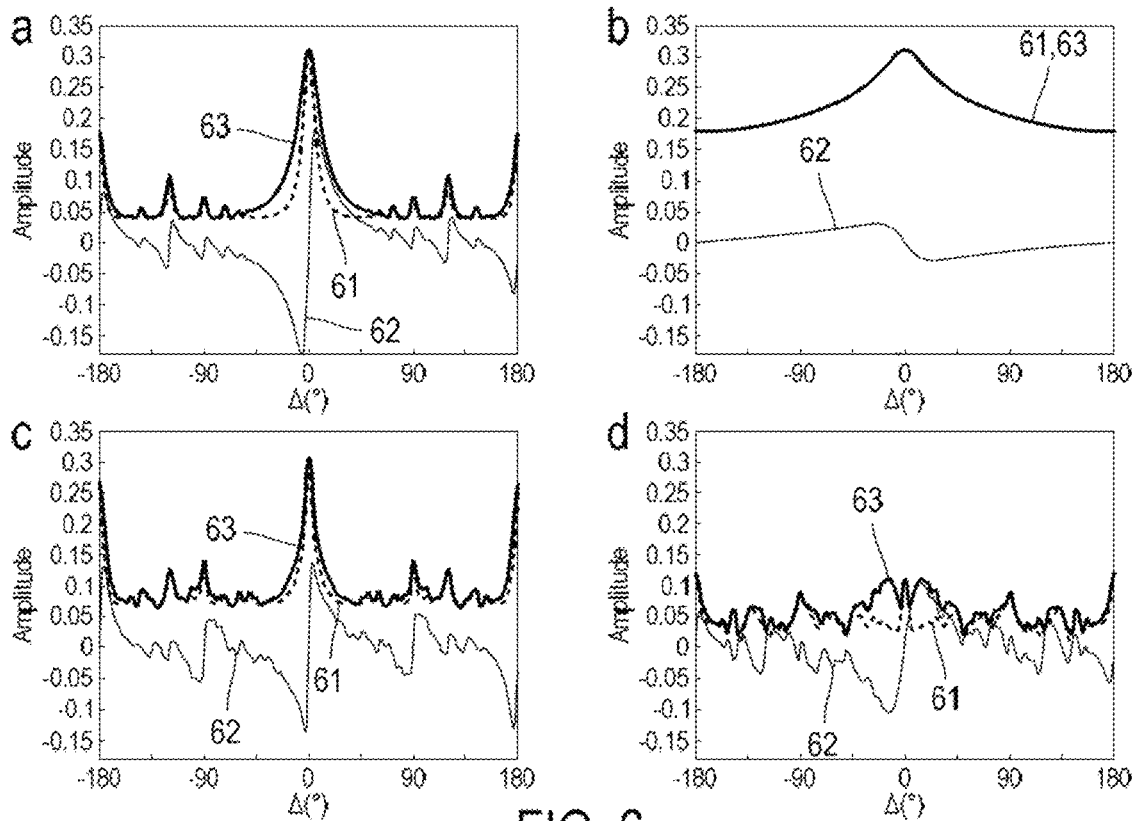
FIG. 6 shows a simulation of steady state for k=0. The transverse magnetization $Q_0$ (a, d, e) is presented after having performed a Fourier transform along $Y^{-1}$: real component (line referenced 61), imaginary component (line referenced 62) and absolute value (line referenced 63) for TR/T$_1$=TR/T$_2$=0.05, $E_d=0.995$ and $N_y=720$. The standard case with a constant series ($\alpha=75°$ and constant apparent frequency sweep rate $u_n=1$) (a) is given for reference. The application of a constant angle amplitude ($\alpha=75°$) with a variation of the apparent frequency sweep rate with $u_n$ (+1, −1) (b) which creates complex conjugate steady states (only a single state is shown here) with a relatively smooth dependence as a function of $\Delta$. For alternate applications (75°, 37.5°) and a constant apparent frequency sweep rate $u_n=1$, interleaved steady states (c after 75°, d after 37.5°) with a complex dependence as a function of $\Delta$.
Figure 7:
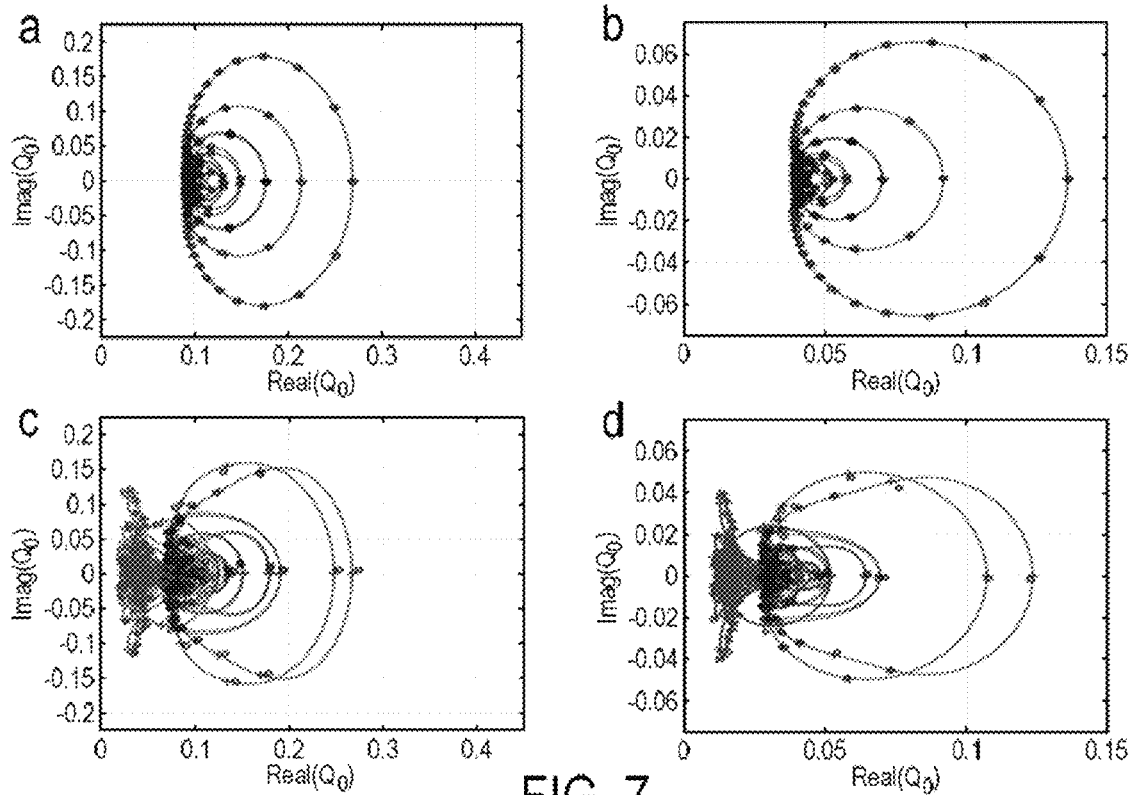
FIG. 7 shows experimental results obtained after fitting the average signals over the tubes. The signals were normalized by the adjusted magnetization value M, and are shown in the complex plane. 'Real' and 'Imag' represent the real and imaginary parts, respectively. The point having the largest real part corresponds to $\Delta=0°$. The points are shown every 2° of increments along the grey dashed line. The measurements (circles and triangles) are comparable to the results of the calculation (lines and crosses). For an angle of 45° with the sequence 1 for the tube for Gd at 1.25 mM (a, best fit with T$_1$/T$_2$=180/157 ms, $E_d$=0.99669 or D=2.29 10$^{-9}$ m$^2$s$^{-1}$, $\alpha=44.01$), and for the ION tube at 160 μM (b, best fit with T$_1$/T$_2$=444/75 ms, $E_d$=0.99671 or D 2.26 10$^1$ m$^2$s$^{-1}$, $\alpha=44.23°$). The interleaved steady states for 45° (dashed line)/22.5° (solid line) obtained with the sequence 2 for the tube for Gd at 1.25 mM (c, best fit with T$_1$/T$_2$=177/156 ms, $E_d$=0.9996 or D=2.19 10$^{-9}$ m$^2$s$^{-1}$, $\alpha=44.64°$), and for the ION tube at 160 μM (d, best fit with T$_1$/T$_2$=518/73 ms, $E_d$=0.9997 or D=1.67 10$^1$ m$^2$s$^{-1}$, $\alpha=44.09°$). The steady states measured are well accounted for by the simulations and the fitted parameters correspond to the expected values.

FIGS. 6 and 7 show the significance of these points, in particular close to 00, 120° and 180°.

In this multiparametric imaging variant, the amplitude of the radiofrequency pulse always corresponds to a magnetization flip angle:

- greater than the Ernst angle for a longitudinal relaxation time T1 equal to 2000 milliseconds, (which allows freedom on the TR and on the type of tissue targeted), and
- less than or equal to 90°.
- the control means 5 being arranged or programmed for this.

In this multiparametric imaging variant, the determination can comprise a spatial continuity condition of each of the data items determined, from the nuclear magnetization, the magnetization flip angle, the diffusion coefficient, the longitudinal relaxation rate or time R1 or T1, and the transverse relaxation rate or time R2 or T2, between different points of the sample (the control means 5 being arranged or programmed for this), preferably the flip angle.

This multiparametric imaging variant will now be explained in greater detail through a first detailed example. Multiple parametric imaging processes have been proposed based on the acquisition of several k states (28-31), but much fewer based on different phase cycling (33-35). In order to exemplify the forward calculation according to the "multiparametric imaging" variant according to the invention and to validate it in the presence of relaxation and diffusion, an inverse problem is proposed based on the acquisition of the k=0 state. The description given here considers the case of the steady state signal for a constant angle amplitude α with different quadratic phase increments, but the expression is general and can be extended to other steady-state cases, or even to the case of transient phases (not in dynamic steady state). For each voxel of the image space, the measured signals are placed in a vector denoted $Q_{0,mes}$. The inverse problem is expressed as a least-square minimization:

$$\min_{M,E_1,E_2,E_d,\alpha} \|Q_{0,mes} - M \times Q_0(E_1, E_2, E_d, \alpha)\|^2. \quad (15)$$

In this expression, a certain number of parameters are unknown: M which represents the signal amplitude at the echo time, the relaxation and diffusion attenuations, as well as the angle amplitude effectively produced. Multiple methods can be used in order to resolve this non-linear least-square problem. Implementation based on the combination of an initialization by comparison with a dictionary, followed by the application of the Gauss-Newton algorithm, is proposed here. Firstly, it can be noted that the problem is linear in M, such that if the vector model $Q_0$ ($E_1$, $E_2$, $E_d$, α) is known, then the best solution for M in the least-square sense is:

$$M = Q_0^H Q_{0,mes} / Q_0^H Q_0. \quad (16)$$

Where the superscript H stands for the Hermitian transpose of vector $Q_0$.

To initialize relaxation parameters to ($M_{init}$, $E_{1,init}$, $E_{2,init}$, $E_{d,init}$, $\alpha_{init}$), $E_{d,init}$ can be calculated assuming the diffusion coefficient is water free and choosing $\alpha_{init}$ as the prescribed angle. This reduces the calculation of $Q_0$ to two dimensions (according to $E_1$ et $E_2$) and different values for $E_1$ et $E_2$ can be chosen in the range from 0 to 1. The linear estimation of M for each pair of values ($E_1$, $E_2$) by using the equation Eq. 16 makes it possible to choose values ($M_{init}$, $E_{1,init}$, $E_{2,init}$) which minimize the residual norm given by the equation Eq. 15. Then, in the iterative non-linear calculation, the signal is normalized by the estimation of M, and, in order to ensure that physical attenuation values are obtained, a change of variables is performed with $E_1 = \exp(-1/x_1^2)$, $E_2/E_1 = \exp(-1/x_{2/1}^2)$, $E_d = \exp(-1/x_d^2)$. The Jacobian matrix is then given by:

$$J = \begin{bmatrix} \text{real}(Q_0) & \text{real}\left(\frac{\partial Q_0}{\partial x_1}\right) & \text{real}\left(\frac{\partial Q_0}{\partial x_{2/1}}\right) & \text{real}\left(\frac{\partial Q_0}{\partial x_d}\right) & \text{real}\left(\frac{\partial Q_0}{\partial \alpha}\right) \\ \text{imag}(Q_0) & \text{imag}\left(\frac{\partial Q_0}{\partial x_1}\right) & \text{imag}\left(\frac{\partial Q_0}{\partial x_{2/1}}\right) & \text{imag}\left(\frac{\partial Q_0}{\partial x_d}\right) & \text{imag}\left(\frac{\partial Q_0}{\partial \alpha}\right) \end{bmatrix}, \quad (17)$$

and can be calculated numerically at the initial vector $[1, x_{1,init}, x_{2/1,init}, x_{d,init}, \alpha_{init}]^T$. An update vector is then obtained by:

$$[dr, dx_1, dx_{2/1}, dx_d, d\alpha]^T = \quad (18)$$
$$(J^H J)^{-1} J^H \begin{bmatrix} \text{real}(Q_0) - \text{real}(Q_{0,mes}/M) \\ \text{imag}(Q_0) - \text{imag}(Q_{0,mes}/M) \end{bmatrix}.$$

The functions real and imag represent the real and imaginary parts respectively. Adding this update vector to the previous estimate refines the solution. M can then be reestimated as M×(1+dr) and used in order to normalize the signal measured for the next iteration. The procedure is repeated until the relative variation of the residual norm given by the equation Eq. 15 is sufficiently small. The matrix $J^H J$ is assumed to be invertible. Considering the Gaussian nature of the noise in MRI, characterized by its identical variance $\sigma^2$ on the real and imaginary parts, the Fisher information matrix (36) is equal to $F = (|M|/\sigma)^2 J^H J$. If it is invertible, its inverse $F^{-1} = (\sigma/|M|)^2 (J^H J)^{-1}$ represents the covariance matrix of the noise on the basis of which the Cramer-Rao lower boundaries can be extracted in order to estimate the precision on the fitted parameters if an unbiased estimator is obtained using the proposed algorithm. If the Fisher matrix is not invertible or is badly conditioned, the pseudo-inverse is calculated in order to ensure numerical stability. Additionally, constraints can be added to the parameters to avoid meaningless values and reduce the numerical instabilities: M is positive, the flip angle remains in a determined range (from 2° to 90° for example), the attenuation terms are bounded between exp(-1) and exp(-10⁻⁴). This generic fitting procedure can be adapted equally well to transient signal fitting or to include acquisitions obtained in an interleaved or sequential manner by varying the series of RF pulses.

If the example of this multiparametric imaging variant that has just been detailed is placed in the context of sequential steady states with several sets each having only a single dynamic steady state, this multiparametric imaging variant can also be implemented according to the invention with several sets by exploiting interleaved steady states (preferably at least 2 interleaved steady states) thus:

in a second example, a constant series $u_{n+1}=v_{n+1}-v_n$ will rather be used, $\Delta$ which is of course constant for each set, and the amplitude of the radiofrequency pulse which follows a non-constant periodic series (thus with a period at least equal to two repetitions with two different amplitudes sufficiently different between 0° et 90°, so as to obtain the at least two different interleaved steady states), as shown in FIGS. 6c and 6d. For each point of interest in the sample, the data (nuclear magnetization, magnetization flip angle, diffusion coefficient, longitudinal relaxation rate or time R1 or T1, and transverse relaxation rate or time R2 or T2) are then determined with the proposed fitting, as shown in FIGS. 7c and 7d. It should be noted that the use of different amplitudes does not add an unknown to the inverse problem because, although there may be an uncertainty on the flip angle produced with a given amplitude, the angles are proportional to the amplitude series. Thus for example the fitting will be adapted by assuming the largest angle of the amplitude series to be an unknown to be determined, the other angles being directly proportional to this angle by a known factor deduced from the amplitude series imposed.

In a third example, a constant angle amplitude will rather be used and a non-constant periodic series $u_{n+1}=v_{n+1}-v_n$ with $\Delta$ constant for each set, but as a priority, close to 0° and/or close to 180°, as shown in FIG. 6b. For each point of interest in the sample, the data (nuclear magnetization, magnetization flip angle, diffusion coefficient, longitudinal relaxation rate or time R1 or T1, and transverse relaxation rate or time R2 or T2) are then determined with the proposed fitting.

Clearly, it is possible to imagine this "multiparametric imaging" variant by mixing the sequential acquisition of interleaved steady states generated by the periodicity of the amplitude and of the series $u_{n+1}=v_{n+1}-v_n$, for example by mixing the second example and the third example. The extreme case of the acquisition of a single set of interleaved steady states with non-constant periodic series of amplitude and/or non-constant $u_{n+1}=v_{n+1}-v_n$ is also possible. To this end, the following will preferably be chosen:

In the case where the amplitude is constant, non-constant $u_{n+1}=v_{n+1}-v_n$ will preferably have a periodicity of at least five points and $\Delta$ will be constant preferably a value of 180°. The series $u_{n+1}=v_{n+1}-v_n$ can be chosen to be arbitrary.

In the case where the amplitude series is periodic, non-constant, preferably with a period of at least five repetitions, the series $u_{n+1}=v_{n+1}-v_n$ can be chosen to be either constant or non-constant with the same period. The choice for $\Delta$, which is then unique and constant for this set alone, will preferably be a value of 0° or of 180° or close to these values. The amplitude series can be chosen arbitrarily between −90° et 90° with values sufficiently different between one another, for example distributed uniformly between 0° et 90°. The series $u_{n+1}=v_{n+1}-v_n$ can be chosen to be arbitrary, preferably with a zero average over the period.

For each point of interest in the sample, the data (nuclear magnetization, magnetization flip angle, diffusion coefficient, longitudinal relaxation rate or time R1 or T1, and transverse relaxation rate or time R2 or T2) are then determined with the proposed fitting. Similarly, the fitting will be adapted in the case of non-constant periodic amplitude for example by assuming the largest angle of the amplitude series to be an unknown to be determined, the other angles being directly proportional to this angle by a known factor deduced from the amplitude series imposed.

The Choice of Acquisition Parameters to Optimize the Measurement of Physical Parameters As stated previously, the Fisher information matrix $F=(|M|/\sigma)^2 J^H J$ makes it possible to characterize the quality of the multiparametric determination using its inverse, the covariance matrix $F^{-1}=(\sigma/|M|)^2(J^H J)^{-1}$, using for example Cramer-Rao bounds. Thus, by using optimization techniques known to a person skilled in the art and listed in a non-exhaustive manner below, it is possible to predefine the acquisition parameters compared to predefined criteria for multiparametric determination of target physical parameters. The acquisition parameters to be defined for multiparametric imaging are:

amplitude and/or the amplitude series of the radiofrequency pulse for the set or sets used to determine the parameters, it being specified that these values can be different for each set, and/or the value of the series $u_{n+1}=v_{n+1}-v_n$ and phase increment $\Delta$ for the set or sets used to determine the parameters, it being specified that these values can be different for each set, and/or the value of $\Delta$ for the set or sets used to determine the parameters, it being specified that these values can be different for each set, and/or the value of TR for the set or for each set used to determine the parameters, it being specified that these values can be different for each set.

the number of set(s).

Secondly, the limits that are physically feasible on the acquisition parameters of the set or of different sets can be defined:

the possible flip angle amplitude values, typically between 0° and 90°, optionally discretized by steps of 1°, and/or the possible values of series $u_{n+1}=v_{n+1}-v_n$, for example by being limited to constant periodic series or non-constant periodic series by fixing the frequency, and/or the possible values of phase increment $\Delta$, typically discretized from 0° to 359° by steps of 1°, and/or the possible values of $\Delta$, typically producing a characteristic distance a comprised between the pixel size in the readout direction (obtained from an $A_{min}$ value) and a fraction of this distance (producing an $A_{max}$ value). The possible values of $\Delta$ can preferably be discretized in the form of multiples of $A_{min}$ less than $A_{max}$. The value $A_{max}$ can be determined based on the physical limits of the gradient system (maximum gradient allowed, maximum application duration available, power dissipated), and/or the possible values of TR, optionally given in a discretized manner between 5 ms and 100 ms, and/or the total number of set(s) and/or the period of the amplitude series and the phase of the radiofrequency pulse can be fixed in order to obtain a given total acquisition time for all of the sets.

In order to perform the optimization leading to the optimal choice of acquisition parameters, a criterion is then defined in the form of a cost function. The literature proposes a series of definitions of the cost function which can express the problem of optimization based on the Fisher information matrix or its inverse, it being understood that the latter can be normalized in order to give more or less weight to the predetermined parameters. The normalization can conventionally be performed using a change of variable of the type Normalized parameter=Parameter divided by a typical value of the parameter. In another embodiment, the cost function can take account of the total acquisition duration. This involves dividing the Fisher information matrix by the total acquisition time or in an equivalent manner, multiplying its inverse by the total acquisition time. This is equivalent to basing the optimization on the information obtained per unit of time. Thus, non-limitatively, it is possible to have the following cost functions:

- minimization of the determinant of the inverse or of the normalized inverse of the Fisher matrix, and/or
- minimization of the trace of the Fisher matrix or of the normalized Fisher matrix: thus a minimization of the sum of the variances is performed, and/or
- minimization of the variance of a single diagonal element of the inverse of the Fisher matrix: thus an optimization of the determination of a single one of the parameters independently of the others is performed, and/or
- minimization of a preselected sum of diagonal elements of the inverse of the Fisher matrix or of the normalized inverse: thus a simultaneous optimization of the determination of several preselected parameters is performed.

In order to define the cost function to be optimized, it is possible to take as a basis the evaluation of the Fisher matrix for typical values of ratio $|M|/\sigma$, relaxation time and diffusion coefficients. It is thus possible, secondly:

- for a given magnetic field (preferably 1.5 T, 3 T, 7 T) to obtain from the literature or from pre-calibration measurements the typical values for the relaxation times and for the diffusion coefficients for one or more target tissues, and/or
- calculate the cost function for each combination of relaxation and diffusion coefficient parameters for each target tissue. At this stage, there is a cost function for each target tissue. An overall cost function can be defined corresponding to the sum of the cost functions of every target tissue by optionally giving a relative weight to each tissue.

Once the overall cost function is defined for the feasible values of the acquisition parameters, the problem of the optimal definition of these parameters is reduced to minimize the cost. Different algorithms known to a person skilled in the art can be used:

- exhaustive evaluations of all of the domain of the feasible values of the acquisition parameters. The set of parameters corresponding to the minimum cost function will be retained, and/or
- more advanced search algorithms, for example of the selection pressure algorithm type or genetic algorithms.

As an example of the embodiments, the following variants are listed:

Variant 1: The set or sets are first obliged to have:
- a fixed series $u_{n+1}=v_{n+1}-v_n$, preferably constant
- fixed phase increment values $\Delta$ that are different across the sets
- a fixed number of sets
- a fixed value of A that is identical across the sets
- a fixed TR that is identical across the sets
- the sets all have the same flip angle which is thus the only parameter that remains to be determined and which is rapidly obtained by an exhaustive search.

Variant 2: The set or sets are first obliged to have:
- a fixed series $u_{n+1}=v_{n+1}-v_n$, preferably constant
- a fixed value of A that is identical across the sets
- a fixed TR that is identical across the sets
- a fixed flip angle that is identical across the sets
- phase increment values $\Delta$ that can take any predefined value, preferably in the range 0° to 359° by steps of 1°
- a set number to be determined.

The optimization algorithm can then for example use the cost function based on the Fisher matrix normalized by unit of time. The set of values of $\Delta$ to be acquired can be at all of the $\Delta$ measurements possible in the predefined range. The cost function is recalculated by removing each value of $\Delta$ from the current set of values. The value of $\Delta$ which is then actually eliminated from the standard set corresponds to that which most reduces the cost function. If the cost function cannot be reduced by eliminating a value from the current set, the algorithm stops and the optimal solution is retained, fixing the values of $\Delta$ to thus acquire only the set number.

Variant 3: The set or sets are first obliged to have:
- a fixed series $u_{n+1}=v_{n+1}-v_n$, preferably constant
- a fixed number of set(s) $N_{sets}$ to be acquired, preferably starting from the total available acquisition time and preferably greater than 4, typically between 5 and 20.
- TR values to be determined from predefined discrete values that can be different across the sets
- values of A to be determined from predefined discrete values that can be different across the sets
- flip angles to be determined from predefined discrete values that can be different across the sets
- phase increment values $\Delta$ to be determined from predefined discrete values that can be different across the sets The optimization algorithm can the for example use the cost function based on the Fisher matrix normalized by unit of time. The optimization algorithm can then for example be initialized by randomly choosing sets of parameters $N_{sets}$, from the possible values. From the possible sets of parameters, the set which minimizes the cost function the most, once added to the sets $N_{sets}$, is then added to the list of retained sets. From the sets of parameters $N_{sets}+1$ retained, the set which minimizes the cost function the most, once removed, is then eliminated from the list of sets $N_{sets}$. The algorithm stops when the same set is added/removed or after a certain number of iterations.

Phantom Experiments

In order to exemplify the extension of the 2D configuration states formalism, experiments were performed with different solutions of contrast agents diluted in water. The imaging was carried out at 1.5 T (Achieva; Philips Healthcare, Best, The Netherlands) using a quadrature head coil for reception. Gadolinium chelates (10, 5, 2.5, 1.25, 0 mM, Dotarem; Guerbet, Villepinte, France) and iron oxide nanoparticles (0.32, 0.16, 0.08, 0.04, 0 mM, CL-30Q02-2, Molday ION, Biopal, Worcester, Mass., USA) were prepared and placed into 15 mL cylindrical vials aligned with the magnetic field $B_0$. A 3D spatially non-selective gradient-echo sequence was modified to allow multiple $Y^{-1}$ values sequentially starting from $Y^{-1}$=(no RF-spoiling, $\Delta=0°$) up to covering the entire unit circle. Rectangular RF pulses were used (duration 150 its for 45° prescribed angle). A parameter was also added to enable the interleaving of the amplitude of angles such that $\alpha_{2n}=\alpha$ and $\alpha_{2n+1}=\alpha/2$ (by halving in real time the amplitude of the B1 transmission field). The spoiling gradient was restricted to the readout direction such that its area corresponds to a=1/$\Delta k_z$ is equal to the size of the imaging pixel. The acquisition parameters were either TR/TE=9.2/4 ms, acquisition matrix 168×84×9 and voxel size 0.5×1×8 mm, pixel bandwidth 217 Hz/pix, acquisition time $T_{acq}$=7 s per volume (hereinafter called 'sequence 1', with a diffusion sensitivity b=1.45 s·mm$^{-2}$) or TR/TE=4.8/2.4 ms, acquisition matrix 84×84×9 and voxel size 1×1×8 mm, pixel bandwidth 434 Hz/pix, acquisition time $T_{acq}$=3.5 s per volume (hereinafter called 'sequence 2', with a diffusion sensitivity b=0.19 s·mm$^{-2}$). The reconstructed voxel size was 0.47×0.47×8 mm. Various prescribed angles were tested sequentially (from 7.5° to 75°), as well as in an interleaved manner. Various $N_y$ steps were performed (by 2° steps for $\Delta$). Given these acquisition parameters, for each $\Delta$ step, the center of the Fourier space was sampled after a few seconds. There was no waiting time between the acquisitions of the different $\Delta$ steps, and 2 to 4 dummy volumes were performed before storing the first volume of data with the result that it can be assumed that steady state was reached. Reconstruction of each volume was performed using the manufacturer's software removing phase corrections that are present by default and using an absolute NMR scale for DICOM file storage. The amplitude and phase images were saved.

Data Analysis

DICOM images were analyzed offline using Matlab (2011b version; The Mathworks, Natick, Mass.) on a recent laptop computer (Intel core i7, RAM 16 Gb, 2.7 GHz) running Microsoft Windows 8. Only the central slice of the 3D volume was processed. A region-of-interest was drawn on each tube to perform the analysis on the average signal per tube. Pixel-by-pixel reconstruction was also performed. Images were normalized by the noise standard deviation a estimated in a region void of signal. To ensure that the signal had Hermitian symmetry with respect to $Y^{-1}$ ($Q_{0,mes}(Y^{-1})$= $\overline{Q_{0,mes}(Y)}$), the phase of the first step $\Delta$=0° was used to estimate $Z_{TE}$ which was then removed from the other steps. A small temporal phase drift was noticed during the acquisition of the multiple steps and corrected. This phase drift was attributed to a thermal drifts of the gradients and it was assumed that this drift varied linearly with time. To estimate this drift, the acquisition corresponding to $\Delta$=0° was repeated at the beginning and at the end of all of the other steps, or the acquisitions obtained for $\Delta$=2° (at the beginning) and for $\Delta$=358° (at the end) were compared. These different steps are theoretically complex conjugates such that their products should be real. The phase of this product is therefore characteristic of the temporal phase drift. Once the drift was characterized, the signal measured for each step was rephased to provide the $Q_{0,mes}$ signal to which the proposed inverse problem was applied. In the iterative estimation of the parameters in the inverse problem, the algorithm for calculating the steady-state proposed in annex 3 was used in cases where a constant angle amplitude and apparent frequency phase drift were applied. The number of the order $N_z$ was chosen fixing $E_{lim,2}$=0.01. In all other cases, the iterative calculation was performed setting the maximum number of repetitions to max($n_{eq}$, $n_0$) where no is the number of repetitions applied to reach the Fourier plane center in imaging, and $n_{eq}$ obtained for $E_{lim,1}$=0.01. Initialization was performed using 32 values for $E_1$ and $E_2/E_1$. Iterations were stopped when the residual norm variation to signal norm varied by less than 10$^{-6}$.

Results

Simulations

Magnetization calculation using the 2D extension of the configuration states formalism is exemplified in FIG. 3. The transverse magnetization coefficients $q_{j,k,n}$, initialized at thermal equilibrium, are plotted for n=1 (with only one central coefficient at j=k=0, FIG. 3-a). Progressively, non-zero coefficients appear, up to a steady state after a large number of pulses. The steady state coefficients are very highly influenced by diffusion (FIG. 3-e and f). Each iteration took ~1 ms with $N_y$=360, and the number of iterations needed to reach steady state was of the order of 5 $T_1$/TR, regardless of the angle series applied. With regard to calculating the steady state following quadratic phase cycling, the two approaches (iterative, based on successive pulse application, and direct, derived from the tri-diagonal algorithm) gave the same steady states. The fast algorithm took ~10 ms to provide the steady state for the same number of points $N_y$=360. The proposed algorithm provided the same results as published previously when the effects of diffusion were disregarded (FIG. 4-a). Steady state very highly depends an $\Delta$ with the creation of multiple stimulated echoes. Specific peaks are visible when $\Delta$ is a rational number of 360° (0°, 180°, 120°, 90°, . . . ). Transverse relaxation and diffusion both reduce the formation of stimulated echoes producing signals closer to the pure Ernst equilibrium (FIG. 4-b-d). The transverse magnetization varies between larger and smaller values, and never reaches the purely real Ernst equilibrium, even if values of $\Delta$ exist for which the magnetization module is equal to it. The dependence of the steady state obtained following a series with constant amplitude and apparent frequency sweep rate is complex and mixed T1, $T_2$ and diffusion contrasts are obtained. However, general characteristics can be extracted. Indeed, the steady states are contained in a plane which itself contains the Ernst equilibrium and is flipped by an effective angle $\alpha_{eff}$=arctan(($E_1$−c)/s) (FIG. 5) with respect to the axis of the main field and regardless of $T_2$ or the diffusion coefficient. This implies a specific dependence with regard to the Ernst angle. For angles of amplitudes lower than the Ernst angle (FIG. 5-a-b), the effective angle is negative and the magnetization varies between 'peaks' which are smaller than the Ernst equilibrium and 'spoiled' values which are larger. For angles larger than the Ernst angle (FIG. 5-e-f), the opposite is observed. Between the two, if the angle is exactly equal to the Ernst angle (FIG. 5-c-d), the effective angle is zero: only the imaginary part of the transverse component of the magnetization varies with $\Delta$ and the real part is always equal to the Ernst equilibrium. The proposed algorithm is not only able to simulate the case of standard quadratic phase cycling (constant amplitude and apparent frequency sweep rate) but also to calculate the interleaved steady states that can be obtained with periodic angle amplitude and apparent frequency sweep rate series. This is demonstrated in FIG. 6 in which a constant angle of 75° with constant apparent frequency sweep rate is compared to a series having a constant angle of 75° with a variation of the apparent frequency sweep rate (+$\Delta$, −$\Delta$), as well as a series that varies in amplitude (75°/37.5°) and has a constant apparent frequency sweep rate. The steady states obtained are very different. The case of alternate amplitudes gives rise to a very complex dependence with A. The case of a constant angle amplitude but with a variation of the apparent frequency sweep rate ($u_{2n}$=1, $u_{2n+1}$=−1) gives rise to two complex conjugate steady states. In this latter case, a slow transition is obtained between $\Delta$=0 and $\Delta$=π (these two states are respectively the same as those obtained for a constant apparent frequency sweep rate with $\Delta=0$ and $\Delta=\pi$). This variation of apparent frequency sweep rate is obtained for example with an effective phase of the RF pulses $\theta_n$ that alternates between $+\Delta/2$ and $-\Delta/2$.

partially accounting for noise propagation, already provide a good estimation of the precision over $R_1$, $R_2$ and D, but are less efficient for predicting the noise propagation over M and over the angle amplitude, in particular because the estimations of these two parameters are more strongly correlated.

|  | Water | Gd 1.25 mM | Gd 2.5 mM | Gd 5 mM | Gd 10 mM | ION 40 μM | ION 80 μM | ION 160 μM | ION 320 μM |
|---|---|---|---|---|---|---|---|---|---|
| M/σ | 797 ± 217 (±115) | 588 ± 114 (±6) | 570 ± 113 (±4) | 548 ± 112 (±3) | 511 ± 117 (±4) | 620 ± 107 (±36) | 623 ± 89 (±33) | 635 ± 89 (±29) | 604 ± 84 (±22) |
| α (°) | 45.53 ± 3.54 (±0.01) | 44.06 ± 0.26 (±0.05) | 44.01 ± 0.21 (±0.10) | 44.13 ± 0.23 (±0.13) | 44.17 ± 0.51 (±0.29) | 43.90 ± 1.87 (±0.11) | 44.28 ± 0.85 (±0.05) | 44.21 ± 0.52 (±0.11) | 44.23 ± 0.41 (±0.24) |
| $R_1$ ($s^{-1}$) | 0.28 ± 0.07 (±0.04) | 5.54 ± 0.13 (±0.06) | 10.05 ± 0.20 (±0.10) | 20.14 ± 0.42 (±0.19) | 39.57 ± 1.98 (±0.57) | 0.78 ± 0.12 (±0.05) | 1.26 ± 0.15 (±0.07) | 2.19 ± 0.18 (±0.11) | 4.24 ± 0.29 (±0.18) |
| $R_2$ ($s^{-1}$) | 0.73 ± 0.27 (±0.17) | 6.47 ± 0.20 (±0.10) | 11.69 ± 0.28 (±0.14) | 23.82 ± 0.55 (±0.25) | 46.78 ± 1.79 (±0.67) | 3.10 ± 0.39 (±0.16) | 6.43 ± 0.49 (±0.22) | 13.47 ± 0.56 (±0.33) | 27.90 ± 0.88 (±0.55) |
| D $10^{-9} m^2 s^{-1}$ | 1.96 ± 0.28 (±0.14) | 2.23 ± 0.14 (±0.08) | 2.27 ± 0.18 (±0.12) | 2.36 ± 0.52 (±0.32) | 2.72 ± 2.53 (±1.66) | 2.27 ± 0.27 (±0.17) | 2.21 ± 0.27 (±0.20) | 2.19 ± 0.40 (±0.29) | 2.15 ± 0.78 (±0.63) |

Phantom Experiments

The average signals over the tubes were able to be efficiently modelled using the approaches proposed over the range of tested flip angles, using both a constant amplitude and apparent frequency sweep rate series and more complex periodic series. After the initiation step, the average number of iterations of the non linear least-square minimization algorithm was ~35. For all tested angle series, the $R_1$ et $R_2$ relaxivity values extracted from the analysis of the average tube signal were linear with concentration for the solutions of Gd and ION, both the fitted angle and the attenuation value $E_d$ being consistent with the prescribed angle and the coefficient of free diffusion within water, respectively. For the 45° constant amplitude case obtained with sequence 1, the molar relaxivities were $r_1/r_2=3.9/4.6$ $mM^{-1}s^{-1}$ for the GD-based agent and $86.4/12.7$ $mM^{-1}s^{-1}$ for the ION-based agent, the fitted angle was 44.3±0.3°, the nuclear magnetization $M_0$ was 471+54 (mean f standard deviation over the tubes) and the diffusion attenuation coefficient was $E_d=0.9967±0.0003$, corresponding to $D=229±0.17$ $10^{-9}$ $m^2 s^{-1}$, consistent with expectations. Representative measured signals as well as corresponding fitted parameters are shown in FIG. 7 for 1.25 mM Gd and 160 μM ION tubes for the interleaved 45° and 45/22.5° cases. As expected, the case of interleaved angle amplitude produces a complex steady state. In order to demonstrate the possibility of performing multiparametric imaging starting from the proposed approach, the signals obtained with the sequence 1 with 45° were adjusted on a pixel-by-pixel basis. The parametric magnetization, flip angle, $R_1$, $R_2$ and diffusion coefficient maps are shown in FIG. 8. Average values as well as the standard deviation calculated over these reconstructed images are given in Table 1 below, and associated with the theoretical value calculated from the diagonal element of the noise covariance matrix. All fitted parameters correspond highly with the expected values. $R_1$ at $R_2$ are linear with concentration (FIG. 9) and make it possible to estimate molar relaxivities consistent with the ones measured from the average tube signals. The flip angle amplitude is very close to the prescribed value and the diffusion coefficient characterizes free diffusion in all tubes. As can be seen, the estimation of the parameters is subject to noise and the precision depends in a complex way on the parameters. The diagonal elements of the noise covariance matrix, while only Table 1 above shows the results obtained after analysis of multiparametric images reconstructed from data obtained from sequence 1 with 45° prescribed angle and $N_y=91$ ($\Delta$ ranging from 0° to 180° with 2° steps). Mean value±measured standard deviation over the tubes for the different fitted parameters. The number in parenthesis corresponds to the Cramer-Rao bound derived from the diagonal elements of the inverse of the Fisher matrix estimated at the fitted mean values. While not all of the noise sources are present in the diagonal elements, this theoretical number already provides a good estimate of the standard deviation, with values close to the measured standard deviation over the tubes for $R_1$, $R_2$ and D.

Discussion

The repeated application of RF pulses interleaved with a constant gradient area was analyzed using the configuration states formalism extended to take account of RF phase pulse modulation. Efficient algorithms for calculation of the magnetization including relaxation and diffusion were deduced. Multi-parametric imaging based on fitting acquired signals of order k=0 with multiple apparent frequency sweep rates as well as alternating angle amplitudes was demonstrated over a wide range $R_1$, $R_2$ and $R_2/R_1$ ratio. Nuclear magnetization, flip angle, free diffusion coefficient and relaxation parameters could be measured, validating the forward and inverse approaches.

The configuration states formalism us equivalent to the extended phase graph approach (6-9), in which magnetization is decomposed into Fourier coefficients evolving in time, which can therefore be extended with a similar graphical representation (8) of the action of given flip angle amplitude and phase, and attenuation by relaxation and diffusion. The approach is also similar to polynomial decomposition performed in the framework of RF pulse design (10,11) extended in 2D, suggesting the potential use of digital filtering techniques to design RF pulses that are potentially sensitive to relaxation and diffusion. It will be noted that the proposed derivation can be adapted to variable TR and gradient areas (9) by adapting the weighting polynomials and shift along $Y^{-1}$ and $Z^{-1}$ to efficiently calculate the response to such sequences. In the case of constant TR and gradient area treated here, the quadratic phase cycling indeed lead to the well-documented steady state (3-5). The order k=0 steady state in this case in contained within a plane crossing the Ernst equilibrium and flipped by a determined effective angle leading to a particular dependence that could be used to rapidly estimate if the prescribed angle is higher or lower than the Ernst angle. This could be done by comparing signals from few Δ values (such as for example 0° and another phase increment). A decrease of the real part indicates an angle greater than the Ernst angle, and reciprocally. The derivation of a fast algorithm based on the expression of a tridiagonal linear system to calculate the steady state in this case, proposed previously with a different derivation (33), additionally includes here the effect of diffusion and can be generalized to more complex weighting polynomials. Moreover, the description according to the configuration states makes it possible to demonstrate that periodic series, modulated in amplitude and phase, produce interleaved steady states, thus extending the contrast manipulation possibilities in this type of sequence. As physical (relaxation rate, diffusion coefficient) and sequence (TR, angle amplitude) parameters are taken into account in the forward problem calculation, the inverse problem is based on the acquisition of different angle series. This type of inverse problem was already proposed using different k states (28-31) or using partial spoiling around 0° with quadratic phase cycling for $T_2$ quantification (33-35). It was chosen here to only use the k=0 state and multiple apparent frequency sweep rates. This made it possible to validate experimentally, using a standard clinical system, the forward problem, as well as to demonstrate the possibility of performing multi-parametric imaging. The inverse problem can be understood to include different k states and multiple angle series. The determination of the best k states and series for measuring is a complex problem that would require in-depth study of the noise covariance matrix. For the question of selecting a minimum number of measurements to optimally estimate a parameter of interest (relaxation, diffusion, etc.) while maintaining an overall acquisition time that is feasible in practice, elements can be specified. Firstly, the magnetization has Hermitian symmetry such that there is no need to acquire −Δ (modulo 360°) increment values if the Δ value is acquired. On the other hand, if the acquisition of the k=0 state is limited by an apparent frequency sweep rate, as proposed with partial spoiling around 0° (33-35), the regions around fractions of 360° seem to be the most informative (0°, 180°, 120°, etc.) such that partial spoiling, defined as sampling around these values, may be sufficient. In addition, as can be seen in FIG. 7a-b, the two first two 'rings' correspond to partial spoiling around 0° and 180°, and the speed of variation increases around 180° with respect to 0° (visible by comparing the position of the signals obtained for 0-2-4° and 180-182-184°, for example), which suggests that 1) a geometrical increase of the type 0-2-4-8-16° around 0°, for example, and 2) a reduction of the steps such that 180-181-182-184-188° around 180° may be sufficient to modulate steady state enough to estimate the parameters. The measured signal was preprocessed to remove the phase at echo-time, as well as a temporal drift. These parameters were estimated and corrected before the application of the inverse problem but could also have been included as parameters to be fitted. The signal phase, always available in an MRI sequence, remains sensitive to $B_0$ field inhomogeneities, making it possible for them to be mapped, or for the dephasings caused by the flow to be quantified. To reduce the effects of phases caused by the flow (9) which do not remain constant during the acquisition and thus do not necessarily reach steady state, flow-compensated gradient forms can be used. Concerning the drift attributed to the thermal effects of the gradients, reducing the number of sampled steps would limit these effects. Calibration is always possible by acquiring 0° increments several times, or by comparing images obtained from Δ and −Δ increments acquired at different times.

The implementation proposed to resolve the inverse problem has a significant calculation time limit when it is applied on the basis of a pixel-by-pixel fitting. However, this algorithm is highly parallelizable, and graphics card processors can be used to accelerate reconstruction. The flip angle was assumed to be a fitted parameter providing a less precise estimation of the other parameters due to noise propagation. To improve precision of the other parameters, the flip angle can be set to the value of the prescribed angle or spatial regularity could be added to it. The angle values used here (between 7.5 and 75°) appeared to provide sufficient variation of the signal measured to fit the different parameters. For low angles (FIG. 5a-b), magnetization varies less than for larger angles (FIG. 5c-f). For even larger angles (not shown), magnetization suffers from saturation phenomena which indicates that an angle maximizing the signal variations as a function of Δ is situated in the amplitude range from 0° to 90°. This optimal angle depends on relaxation and diffusion. The possibility of mapping the flip angle, relaxation and diffusion in the low angle range <90° used in the gradient-echo sequences, angles significantly smaller than those used for spin-echo sequences, suggests that the proposed approach could be used independently of the spatial homogeneity of the $B_1$ transmission field typically obtained at higher magnetic field $B_0$ or with surface antennae, and with lower specific absorption rates. The use of interleaved or sequential angle amplitudes (variable or actual angle type techniques) (15-21) would increase the conditioning of the inverse problem and consequently the parameter fitting. The fact that the purely real Ernst equilibrium is difficult to reach, even for the quadratic phase increase used to perform spoiling using 117° or other suitable value increments (4,15, 16) indicates that both transverse relaxation and diffusion must be taken into account to describe the signal, and that there is a potential improvement if both real and imaginary parts are used. Indeed, the analyses in the majority of the preceding works only exploit the transverse magnetization and thus lose information in the process (15-20).

Interestingly, the action of diffusion is very strong, even with the small b values used here. Indeed, the value reported here only takes into account the first order diffusion weighting between two TR. On the one hand, weighting of the higher orders increases the $k^2$ strength, and these orders are maintained by coherence on the longitudinal and transverse components. The effective diffusion time is thus larger than TR. The effective diffusion weighting this thus more difficult to define. An effective diffusion time T, that depends on $T_1$, $T_2$ and flip angle, can be defined; it is bounded by $T_2 < T_1$. The sequence is then equivalent to applying a constant gradient during this time, and the diffusion weighting then increases as $T^3$. A very fast increase is then expected: with a TR of ~10 ms and assuming T~100 ms, the effective b value is then $(T/TR)^3 = 10^3$ times larger than that defined between each TR. The counterpart is that the diffusion weighting is dependent on relaxation parameters. This inhomogeneous aspect of diffusion weighting can be seen as a limitation, or as an additional way to filter out the signals of certain tissue types using the application of several b values playing on the sequence parameter a or equivalently on the gradient waveform and its total area. This can allow more specific access to compartments at a scale smaller than the imaging voxel size. Playing on the gradient direction could also allow access to preferential diffusion directions (37,38), with the advantage of a gradient-echo sequence (good spatial resolution, short echo time, high bandwidth and limited associated spatial deformations). In vivo, diffusion can also be limited, magnetization transfer phenomena or partial volume effects can occur. These phenomena could be taken into account using more complex weighting polynomials (37,38), modeling exchange (39) or multi-compartments, and could be characterized using fast steady-state sequences described by steady-state formalism. To reduce total acquisition time, the proposed RF pulse modulations could be combined with parallel imaging (40), compressed sensing (41) or fingerprinting (42), approaches in which extended configuration states formalism could provide a method for selecting pseudo-random sampling patterns.

Variant of the First Embodiment of a Method and a Device According to the Invention: Rapid Estimation of the Prescribed Angle;

Following on from what was said in the preceding paragraphs in the "discussion" section concerning the possibility of rapidly estimating if the prescribed angle is larger or smaller than the Ernst angle, a variant (called "Ernst angle") of the first embodiment of the method according to the invention implemented by the first embodiment of the device according to the invention (and described only in relation to its differences or characteristics in respect to this first embodiment) is situated in the framework of sequential steady states and comprises:

an acquisition of a signal (necessarily of the order of coherence equal to zero) for two steady states corresponding to two identical radiofrequency pulse amplitudes but two different Δ, the control means 5 being arranged or programmed in order to control the acquisition means 6 in order to perform such an acquisition, a comparison (using the calculation means 7, which are arranged or programmed for this) of the signal for these two steady states, and deducing (using the calculation means 7, which are arranged or programmed for this), from this comparison, whether the amplitude of the radiofrequency pulse produces an effective flip angle that is larger or smaller than or equal to the Ernst angle (equal to a cos(exp(-TR/T1))) for the sample.

One of the two different Δ, which will be denoted $\Delta_1$, is preferentially equal to zero, but other values can be taken such as 180°, or 120°, or 90°, or any other value producing a visible 'peak' on FIG. 5. The second value, denoted $\Delta_2$, will be preferentially chosen for a 'trough' for example that around zero (approximately between 25° and 40°), or around 180° (approximately between 192° and 202°), or also around 120° (approximately between 106° and 112° or between 128° and 134°). As can be understood from FIG. 5 in which the real part (numbered line 51) varies around the Ernst equilibrium value (dashed line having the values s*(1−E1)/(1−c*E1):

if the real part of the signal Sig1 obtained for $\Delta_1$ is greater than the real part of the signal Sig2 obtained for $\Delta_2$, the effective flip angle is larger than the Ernst angle, if the real part of the signal Sig1 obtained for $\Delta_1$ is equal to the real part of the signal Sig2 obtained for $\Delta_2$, the effective flip angle is equal to the Ernst angle, if the real part of the signal Sig1 obtained for $\Delta_1$ is smaller than the real part of the signal Sig2 obtained for $\Delta_2$, the effective flip angle is smaller than the Ernst angle, Preferentially, $\Delta_1$ is equal to zero and $\Delta_2$ corresponds to one of the troughs given in the preceding paragraph. If $\Delta_1$ is chosen equal to 0° or 180°, it would be possible for example to establish the complex signal ratio Sig2/Sig1 directly on the basis of the real part of this ratio: if this is greater than 1, the angle is less than the Ernst angle, if this is equal to 1, the angle is equal to the Ernst angle, if this is less than 1, the angle is greater than the Ernst angle.

Variant of the First Embodiment of a Method and a Device According to the Invention: Modulation of the Effects of Diffusion;

Following on from what was said in the preceding paragraphs in the "discussion" section concerning the importance of diffusion, a variant (called "diffusion variant") of the first embodiment of the method according to the invention implemented by the first embodiment of the device according to the invention (and described only with respect to its differences or characteristics in relation to this first embodiment) is situated in the framework of sequential steady states (optionally combinable with the interleaved steady states): several sets are transmitted sequentially, and (the control means 5 being arranged and programmed for this):

the encoding direction differs between different sets, and/or the value of A differs between two sets, and/or the shape of the magnetic field gradient in the encoding direction differs between different sets.

This "diffusion" variant also comprises quantifying using calculation means 7, which are arranged or programmed for this) a diffusion coefficient in the sample or determining a predominant direction of diffusion in the sample or a weighting of the diffusion in the sample by making use of the difference in A and/or the encoding direction and/or gradient waveform between the different sets. This quantification or determination or weighting is typically implemented by applying several sets with different b values (cf Annex 1, in particular Equation 19 applied to the encoding gradient to calculate b) and/or different directions of encoding gradient application. It will thus be arranged for a $b_{max}$ value to be defined preferably between 0.1 and 5000 mm$^2 \cdot$s$^{-1}$, from which the corresponding area A (denoted $A_{max}$) and the shape of the encoding gradient will be determined by calculation (preferably for a trapezoid with the maximal amplitude of gradients applicable on this or these axis or axes, and with feasible ramps for the gradient system). Starting from the determination of $A_{max}$ and of the shape, as well as in combination with the constraints imposed by the imaging gradients, a minimum applicable TR value $TR_{min}$ will be determined. A TR will thus be chosen that is at minimum equal to $TR_{min}$ for the different sets. A $b_{min}$ value will also be defined, preferably between 0.1 and 5000 mm$^2 \cdot$s$^{-1}$, and less than $b_{max}$. This $b_{min}$ value is then with the same TR, and will preferably be performed by modifying the amplitude of the encoding gradient rather than its shape.

Generation of diffusion-weighted images can be done with two sets performed for a constant series $u_n=1$ that is identical for all sets, a Δ value identical between the sets and a constant flip angle amplitude that is identical for the sets, preferably larger than the Ernst angle and preferably less than 90°. Studies of the signal variation as a function of b indicates that the value of Δ to be performed is either close to 0°, between Δ=0° inclusive and Δ=32° inclusive modulo 360°, or close to 180°, between Δ=164° inclusive and Δ=196° inclusive modulo 360°, or, for an absolute value for Δ close to 120°, between Δ=112° inclusive and Δ=128° inclusive modulo 360°, or, for an absolute value for Δ between 45°, 60°, 72°, 90°, and 144° modulo 360°. The two sets are then performed sequentially with the encoding gradient having a $b_{max}$ (set 1) and $b_r$ (set 2) value. Visualization of the diffusion-weighted images can then be done by means of the difference in the signals obtained between the set obtained with $b_{min}$ minus the set obtained with $b_{max}$. As the signals are complex, a significant module (called hypersignal) then corresponds to a region having significant diffusion, information visualized qualitatively. It should be noted here that the larger the diffusion coefficient, the more the dynamic equilibrium signal is attenuated and the more it approaches the Ernst equilibrium for the set corresponding to $b_{max}$ in relation to the set corresponding to $b_{min}$.

Having described the way in which the diffusion images are weighted starting from two sets with different b values, it is possible to extend the method to determination of a predominant direction of diffusion using the diffusion tensor concept known in the art (Mori S, Zhang J. Principles of diffusion tensor imaging and its applications to basic neuroscience research. Neuron 2006; 51(5):527-539). In these techniques, several images are performed with different directions of diffusion-weighting gradient application. The signals are fitted to a symmetrical 3×3 matrix, making it possible to extract three eigenvalues and three associated eigenvectors. In a similar way here, the signals from several sets acquired will be used for example sequentially with identical $b_{max}$ values and different directions, optionally completed by a reference acquisition with a low bat value. With this signal that depends on the different directions of encoding gradient application and that is then closer to the Ernst equilibrium when diffusion is strong, it is then possible to determine the predominant direction of diffusion by fitting the components of a tensor on the measured signals, corresponding for example to the eigenvector having the largest eigenvalue, or even to extract other parameters such as the anisotropic fraction as reported in the state of the art. From a methodological point of view, the ways to optimize the set number and to determine the orientations to be applied are thus aspects available in the art. As in the diffusion tensor imaging techniques, for this variant, the $b_{max}$ value to be retained depends on the relaxation parameters and is to be optimized for each target tissue to ensure that this sufficiently attenuates the signal as a function of the orientation, but not so much as to be too close to the Ernst equilibrium. These optimization principles are known to a person skilled in the art. It should be noted here that the importance of the method according to the proposed invention that has a diffusion sensitivity greater that the current techniques according to the state of the art, as mentioned in the 'discussion' part Having insisted on the possibility of sensitizing the diffusion signal using the encoding gradient having different b values, it should be noted that this aspect can be combined with the variant called "multiparametric imaging" variant. Sets with different b values can also be acquired sequentially to increase the diffusion sensitivity of certain sets and to make the determination of this parameter using the inverse problem more precise. The choice of different sets can be derived from the preceding paragraph as well as from the description of the measuring points given in the description of the variant called "multiparametric imaging" variant.

In the present description of certain embodiments and variants of the invention, the configuration states formalism was extended to take into account the RF pulse phase modulation in repeated sequences including interleaved radiofrequency pulses with non-zero gradient area. This extension provided a framework for efficient calculation and better understanding of the formation of stimulated echoes though a graphical representation. Relaxation and diffusion were taken into account, and the concepts can be generalized to other types of attenuation mechanisms. Moreover, periodic steady states can be maintained, extending the possibilities for manipulating the contrast A generic inverse problem was proposed to fit the magnetization, the flip angle amplitude, the relaxation rate and the diffusion coefficient based on the acquisition of multiple series with modulated amplitude and/or phase providing quantitative imaging tools based on configuration states (or QuICS for "QUantitative Imaging using Configuration States").

Of course, the invention is not limited to the examples which have just been described and numerous adjustments can be made to these examples without exceeding the scope of the invention.

Of course, the various characteristics, forms, variants and embodiments of the invention can be combined together in various combinations provided that they are not incompatible or mutually exclusive.

In particular, all the previously described variants and embodiments can be combined together.

APPENDIX 1: THE EFFECTS OF DIFFUSION ON THE WEIGHTING POLYNOMIALS

The b value used to characterize diffusion gradients and defined for a single axis application is:

$$b = -\gamma^2 \cdot I = -\int_0^{TR} \left( \int_0^\tau \gamma G(t)dt \right)^2 d\tau. \tag{19}$$

The effect of diffusion is different for a given order k (in plane dephasing is $Z^{-k}$), as right after the RF pulse, this order already has a phase equal to $2\pi k/a$:

$$b_k = -\gamma^2 \cdot I_k = -\int_0^{TR} \left( k \frac{2\pi}{a} + \int_0^\tau \gamma G(t)dt \right)^2 d\tau. \tag{20}$$

If the gradient is constant as in (31) the integration leads to:

$$b_k = -\gamma^2 \cdot I_k = -\left(\frac{2\pi}{a}\right)^2 TR\left(k^2 + k + \frac{1}{3}\right), \tag{21}$$

Which then makes it possible to define the coefficients for the weighting polynomial $W_2$: $w_{2,k} = E_2 E_d^{k^2+k+1/3}$. If the extreme case in which the gradient can be approximated as a Dirac pulse applied before the next RF pulse is assumed, then $W_{2,k} = E_2 E_d^{k^2}$: the weighting polynomial then corresponds to a symmetric Gaussian filter. Further accounting for the exact gradient waveform can be done, and there is a possible modulation of diffusion filtering through the gradient waveforms to reduce the effects on predefined orders k. For example, if the gradient is applied along the readout direction, as presented experimentally in the present description, if TE is assumed to be in the center of the acquisition window (duration $T_{obs}$), the effects of prephasing gradient (assumed to be applied during a time $TE-T_{obs}/2$) followed by the readout and spoiling gradients (assumed to be applied during a time $TR-TE-T_{obs}/2$), the calculation of the weighting polynomial leads to $$w_{2,k} = E_2 E_d^{k^2 + \frac{1}{2}\left(4-5\frac{TE}{TR}-\frac{3}{2}\frac{T_{obs}}{TR}\right)k + \left(\frac{10}{12}-\frac{9}{12}\frac{TE}{TR}-\frac{9}{24}\frac{T_{obs}}{TR}\right)}.$$

In all cases, the expressions can be reformatted as $W_{2,k}=E_2 E_d^{(k-k_c)^2+cst}$ showing that, for free diffusion, Gaussian filtering is performed centered on $k=k_c$ and with an attenuation $E_2 E_d^{cst}$ applied over all coefficients (where cst stands for a constant). Similarly, the coefficients for the weighting polynomial $W_1$ weighting the longitudinal magnetization correspond to a Gaussian filter centered in zero, $W_{1,k}=E_1 E_d^{k^2}$ as a k order is maintained between two TRs without further dephasing.

APPENDIX 2: THE SHIFT OPERATOR

The action of changing the phase increment from one pulse to the other is equivalent to a change of an apparent frequency. Consequently, in the polynomial description used here, every coefficient needs to be rephased adequately. Magnetization can be decomposed as:

$$U = \sum_{k=-\infty}^{+\infty} U_k(Y^{-1}) Z^{-k}, \qquad (22)$$

where $U_k(Y^{-1})$ are polynomials in $Y^{-1}$. The convolution with $S_v$ is performing this change of apparent frequency:

$$S_v * U = \sum_{k=-\infty}^{+\infty} U_k(Y^{-1}) Y^{-vk} Z^{-k}, \qquad (23)$$

With the extension of the 2D configuration states formalism, the action is to translate each polynomial $U_k(Y^{-1})$ in the Y direction by a step which depends on the order k as shown in FIG. 2.

Some advantageous relations can be exploited:

$$Y^{-v} Z^{-1}(S_v * U) = Y^{-v} \sum_{k=-\infty}^{+\infty} U_k Y^{-vk} Z^{-(k+1)} \qquad (24)$$

$$= \sum_{k=-\infty}^{+\infty} U_{k-1} Y^{-vk} Z^{-k}$$

$$= S_v * (Z^{-1} U),$$

It can be noted that $S_v$ is equal to its complex conjugate and the operators can be combined:

$$\overline{S_v} = \sum_{k=-\infty}^{+\infty} Y^{vk} Z^k = \sum_{k=-\infty}^{+\infty} Y^{-vk} Z^{-k} = S_v, \qquad (25)$$

$$S_u * S_v = S_{u+v}. \qquad (26)$$

APPENDIX 3 RAPID CALCULATION OF THE STEADY-STATE USING THE TRIDIAGONAL MATRIX ALGORITHM

In order to calculate the steady-state for quadratic phase cycling, it is possible to use the recurrence relation between three successive iterations. To this end, the polynomial representing the transverse magnetization is written as a sum of polynomial in $Y^{-1}$:

$$Q_\infty^s = \sum_{k=-\infty}^{+\infty} q_k(Y^{-1}) Z^{-k} \qquad (27)$$

If this expression is substituted into the steady-state relationships:

$$S_\Delta * (S_\Delta - cW_1) * Q_\infty^s = s(1-E_1) + \qquad (28)$$
$$\frac{c+1}{2}(S_\Delta - W_1) * (Z^{-1} W_2^* Q_\infty^s) + \frac{c-1}{2}(S_\Delta + W_1) * (\overline{Z^{-1} W_2^* Q_\infty^s})$$

$$S_\Delta * (Q_\infty^s - \overline{Q_\infty^s}) = Z^{-1} W_2^* Q_\infty^s - \overline{Z^{-1} W_2^* Q_\infty^s} \qquad (29)$$

The following expressions are obtained:

$$q_k \alpha_k = s(1-E_1)\delta_{k,0} + [\eta_k \chi_k q_{k-1} - \kappa_k \gamma_k \overline{q_{-k-1}}] \qquad (30)$$

$$q_k - \chi_k q_{k-1} = \overline{q_{-k}} - \kappa_k \overline{q_{-k-1}} \qquad (31)$$

With $\alpha_k = 1 - cY^k w_{1,k}$, $\beta_k = c - Y^k w_{1,k}$, $\gamma_k = \frac{1}{2}(\alpha_k - \beta_k)$, $\eta_k = \frac{1}{2}(\alpha_k + \beta_k)$, $\chi_k = w_{2,k-1} Y^k$, $\kappa_k = w_{2,-k-1} Y^k$, $\delta_{k,m} = 1$ if m=k, and 0 elsewhere (the Dirac distribution).

The conjugate operation is removed using combinations of the previous expressions and shifting indexes:

$$q_k \frac{\alpha_k}{\gamma_k} - \chi_k \frac{\eta_k}{\gamma_k} q_{k-1} - s\frac{(1-E_1)}{\gamma_0}\delta_{k,0} = -\kappa_k \overline{q_{-k-1}} \qquad (32)$$

$$-q_{k-1}\frac{\alpha_{k-1}}{\kappa_{k-1}\gamma_{k-1}} + \frac{\chi_{k-1}}{\kappa_{k-1}}\frac{\eta_{k-1}}{\gamma_{k-1}} q_{k-2} + s\frac{(1-E_1)}{\kappa_0 \gamma_0}\delta_{k-1,0} = \overline{q_{-k}} \qquad (33)$$

such that the following expression provides a recurrence over three consecutive k states:

$$-a_k q_{k-1} + b_k q_k - c_k q_{k+1} = r_{-1}\delta_{k+1,0} + r_0 \delta_{k,0} \qquad (34)$$

With $a_k = \frac{\chi_k \eta_k}{\alpha_k}$, $b_k = 1 + \kappa_k \chi_{k+1} \frac{\gamma_k}{\alpha_k} \frac{\beta_{k+1}}{\gamma_{k+1}}$, $c_k = \frac{\eta_{k+1}}{\gamma_{k+1}} \frac{\kappa_k \gamma_k}{\alpha_k}$, $r_0 = s\frac{1-E_1}{1-cE_1}$, $r_{-1} = -s\frac{(1-E_1)}{\gamma_0} \frac{\kappa_{-1}\gamma_{-1}}{\alpha_{-1}}$.

This can be written as a tridiagonal linear system:

$$\begin{bmatrix} b_{-n} & -c_{-n} & & & & & & & \\ \cdots & \cdots & \cdots & & & & & & \\ & -a_{-2} & b_{-2} & -c_{-2} & & & & & \\ & & -a_{-1} & b_{-1} & -c_{-1} & & & & \\ & & & -a_0 & b_0 & -c_0 & & & \\ & & & & -a_1 & b_1 & -c_1 & & \\ & & & & & \cdots & \cdots & \cdots & \\ & & & & & & & -a_{n-1} & b_{n-1} \end{bmatrix} \begin{bmatrix} q_{-n} \\ \cdots \\ q_{-2} \\ q_{-1} \\ q_0 \\ q_1 \\ \cdots \\ q_{n-1} \end{bmatrix} = \begin{bmatrix} 0 \\ \cdots \\ 0 \\ r_{-1} \\ r_0 \\ 0 \\ \cdots \\ 0 \end{bmatrix} \quad (35)$$

Which is classically solved using a tridiagonal matrix algorithm:

$$\begin{bmatrix} 1 & -g_{-n} & & & & & & \\ & 1 & \cdots & & & & & \\ & & 1 & -g_{-2} & & & & \\ & & & 1 & -g_{-1} & & & \\ & & & -h_0 & 1 & & & \\ & & & & -h_1 & 1 & & \\ & & & & & \cdots & 1 & \\ & & & & & & -h_{n-1} & 1 \end{bmatrix} \begin{bmatrix} q_{-4} \\ \cdots \\ q_{-2} \\ q_{-1} \\ q_0 \\ q_1 \\ \cdots \\ q_3 \end{bmatrix} = \begin{bmatrix} 0 \\ 0 \\ 0 \\ \rho_{-1} \\ \rho_0 \\ 0 \\ 0 \\ 0 \end{bmatrix} \quad (36)$$

With $$g_{k+1} = \frac{c_{k+1}}{b_{k+1} - a_{k+1} g_k}$$

calculated iteratively assuming $$g_{-n-1} = 0, h_k = \frac{a_k}{b_k - c_k h_{k+1}}$$

calculated assuming $$h_n = 0, \rho_0 = \frac{r_0}{b_0 - c_0 h_1} \text{ and } \rho_{-1} = \frac{r_{-1}}{b_{-1} - a_{-1} g_{-2}}.$$

The final value of k=0, $q_0$ is finally given by the remaining 2×2 matrix inversion:

$$q_0 = \frac{\rho_0 + h_0 \rho_{-1}}{1 - h_0 g_{-1}} \quad (37)$$

As for the $q_{-1}$ term:

$$q_{-1} = \frac{\rho_{-1} + g_{-1} \rho_0}{1 - h_0 g_{-1}} \quad (38)$$

Using this framework, every steady-state coefficient can be extracted using the backward relationships. The value of $p_0$ can then be determined by $$p_0 = c \frac{1 - E_1}{1 - cE_1} - sw_{2,-1} \frac{q_{-1} + \overline{q_{-1}}}{2}.$$

The calculation an be performed for a range of complex exponential $Y^{-1}$ and Fourier transformed to obtain the coefficients of the polynomial in $Y^{-1}$. This algorithm is similar to the continuous fraction expansion proposed elsewhere (33), with a different derivation and expression, notably including diffusion weighting, and by extension any weighting whatever.

BIBLIOGRAPHIC REFERENCES

1. Ernst R R, Bodenhausen G, Wokaun A. Principles of nuclear magnetic resonance in one and two dimensions. In: Clarendon O, editor, 1987. p 125.
2. Darrasse L, Mao L, Saint-James H. Steady-State management in Fast Low-Angle Imaging. Proceedings of the International Society for Magnetic Resonance in Medicine 1986; Montreal, Quebec, Canada. p 944.
3. Zur Y, Bendel P. Elimination of the Steady State Transverse Magnetization in Short TR Imaging. Proceedings of the International Society for Magnetic Resonance in Medicine 1987; New York, N.Y., USA.
4. Zur Y, Wood M L, Neuringer U. Spoiling of transverse magnetization in steady-state sequences. Magnetic resonance in medicine: official journal of the Society of Magnetic Resonance in Medicine/Society of Magnetic Resonance in Medicine 1991; 21(2):251-263.
5. Crawley A P, Wood M L, Henkelman R M. Elimination of transverse coherences in FLASH MRI. Magnetic resonance in medicine: official journal of the Society of Magnetic Resonance in Medicine/Society of Magnetic Resonance in Medicine 1988; 8(3):248-260.
6. Hennig J. Echoes—how to generate, recognize, use or avoid them in MR-imaging sequences. Part I: Fundamental and not so fundamental properties of spin echoes. Concept Magnetic Res 1991; 3(3):125-143.
7. Hennig J. Echoes—how to generate, recognize, use or avoid them in MR-imaging sequences. Part II: Echoes in imaging sequences. Concept Magnetic Res 1991; 3(4): 179-192.
8. Scheffler K. A pictorial description of steady-states in rapid magnetic resonance imaging. Concept Magnetic Res 1999; 11 (5):291-304.
9. Weigel M. Extended phase graphs: Dephasing, RF pulses, and echoes—pure and simple. Journal of magnetic resonance imaging: JMRI 2014.
10. Pauly J, Leroux P, Nishimura D, Macovski A. Parameter Relations for the Shinnar-Leroux Selective Excitation Pulse Design Algorithm. Ieee T Med Imaging 1991; 10(1):53-65.
11. Le Roux P, Hinks R S. Stabilization of echo amplitudes in FSE sequences. Magnetic resonance in medicine: official journal of the Society of Magnetic Resonance in Medicine/Society of Magnetic Resonance in Medicine 1993; 30(2):183-190.

12. Le Roux P. Simplified model and stabilization of SSFP sequences. Journal of magnetic resonance 2003; 163(1):23-37.
13. Ganter C. Analytical solution to the transient phase of steady-state free precession sequences. Magnetic resonance in medicine: official journal of the Society of Magnetic Resonance in Medicine/Society of Magnetic Resonance in Medicine 2009; 62(1):149-164.
14. Ganter C, Settles M, Dregely I, Santini F, Scheffier K, Bieri O. B1+-mapping with the transient phase of unbalanced steady-state free precession. Magnetic resonance in medicine: official journal of the Society of Magnetic Resonance in Medicine/Society of Magnetic Resonance in Medicine 2013.
15. Preibisch C, Deichmann R. Influence of RF spoiling on the stability and accuracy of T1 mapping based on spoiled FLASH with varying flip angles. Magnetic resonance in medicine: official journal of the Society of Magnetic Resonance in Medicine/Society of Magnetic Resonance in Medicine 2009; 61(1):125-135.
16. Liberman G, Louzoun Y, Ben Bashat D. T(1) mapping using variable flip angle SPGR data with flip angle correction. Journal of magnetic resonance imaging: JMRI 2014; 40(1):171-180.
17. Fram E K, Herfkens R J, Johnson G A, Glover G H, Karis J P, Shimakawa A, Perkins T G, Pelc N J. Rapid calculation of T1 using variable flip angle gradient refocused imaging. Magnetic resonance imaging 1987; 5(3):201-208.
18. Lin W, Song H K. Improved signal spoiling in fast radial gradient-echo imaging: Applied to accurate T(1) mapping and flip angle correction. Magnetic resonance in medicine: official journal of the Society of Magnetic Resonance in Medicine/Society of Magnetic Resonance in Medicine 2009; 62(5):1185-1194.
19. Schabel M C, Morrell G R. Uncertainty in T(1) mapping using the variable flip angle method with two flip angles. Physics in medicine and biology 2009; 54(1):N1-8.
20. Hurley S A, Yarnykh V L, Johnson K M, Field A S, Alexander A L, Samsonov A A. Simultaneous variable flip angle-actual flip angle imaging method for improved accuracy and precision of three-dimensional T1 and B1 measurements. Magnetic resonance in medicine: official journal of the Society of Magnetic Resonance in Medicine/Society of Magnetic Resonance in Medicine 2012; 68(1):54-64.
21. Nehrke K. On the steady-state properties of actual flip angle imaging (AFI). Magnetic resonance in medicine: official journal of the Society of Magnetic Resonance in Medicine/Society of Magnetic Resonance in Medicine 2009; 61(1):84-92.
22. Hanicke W, Vogel H U. An analytical solution for the SSFP signal in MRI. Magnetic Resonance in Medicine 2003; 49(4):771-775.
23. Bruder H, Fischer H, Graumann R, Deimling M. A new steady-state imaging sequence for simultaneous acquisition of two MR images with clearly different contrasts. Magnetic resonance in medicine: official journal of the Society of Magnetic Resonance in Medicine/Society of Magnetic Resonance in Medicine 1988; 7(1):35-42.
24. Bieri O, Ganter C, Scheffler K. Quantitative in vivo diffusion imaging of cartilage using double echo steady-state free precession. Magnetic resonance in medicine: official journal of the Society of Magnetic Resonance in Medicine/Society of Magnetic Resonance in Medicine 2012; 68(3):720-729.
25. Heule R, Ganter C, Bieri O. Rapid estimation of cartilage T with reduced T sensitivity using double echo steady state imaging. Magnetic resonance in medicine: official journal of the Society of Magnetic Resonance in Medicine/Society of Magnetic Resonance in Medicine 2013.
26. Heule R, Ganter C, Bieri O. Triple echo steady-state (TESS) relaxometry. Magnetic resonance in medicine: official journal of the Society of Magnetic Resonance in Medicine/Society of Magnetic Resonance in Medicine 2014; 71(1):230-237.
27. Kaiser R, Bartholdi E, Ernst R R. Diffusion and field-gradient effects in NMR Fourier spectroscopy. The Journal of Chemical Physics 1974; 60(8):2966-2979.
28. Merboldt K D, Bruhn H, Frahm J, Gyngell M L, Hanicke W, Deimling M. MRI of "diffusion" in the human brain: new results using a modified CE-FAST sequence. Magnetic resonance in medicine: official journal of the Society of Magnetic Resonance in Medicine/Society of Magnetic Resonance in Medicine 1989; 9(3):423-429.
29. Buxton R B. The diffusion sensitivity of fast steady-state free precession imaging. Magnetic resonance in medicine: official journal of the Society of Magnetic Resonance in Medicine/Society of Magnetic Resonance in Medicine 1993; 29(2):235-243.
30. Zur Y, Bosak E, Kaplan N. A new diffusion SSFP imaging technique. Magnetic resonance in medicine: official journal of the Society of Magnetic Resonance in Medicine/Society of Magnetic Resonance in Medicine 1997; 37(5):716-722.
31. Freed D E, Scheven U M, Zielinski U I, Sen P N, Hurlimann M D. Steady-state free precession experiments and exact treatment of diffusion in a uniform gradient. J Chem Phys 2001; 115(9):4249-4258.
32. Deimling M; Method to determine the ADC coefficients in diffusion-weighted magnetic resonance imaging given use of steady-state sequences 2005.
33. Ganter C. Steady state of gradient echo sequences with radiofrequency phase cycling: analytical solution, contrast enhancement with partial spoiling. Magnetic resonance in medicine: official journal of the Society of Magnetic Resonance in Medicine/Society of Magnetic Resonance in Medicine 2006; 55(1):98-107.
34. Bieri O, Scheffler K, Welsch G H, Trattnig S, Mamisch T C, Ganter C. Quantitative mapping of T2 using partial spoiling. Magnetic resonance in medicine: official journal of the Society of Magnetic Resonance in Medicine/Society of Magnetic Resonance in Medicine 2011; 66(2):410-418.
35. de Sousa P L, Vignaud A, Caldas de Almeida Araujo E, Carlier P G. Factors controlling T2 mapping from partially spoiled SSFP sequence: optimization for skeletal muscle characterization. Magnetic resonance in medicine: official journal of the Society of Magnetic Resonance in Medicine/Society of Magnetic Resonance in Medicine 2012; 67(5):1379-1390.
36. Liu W J, Wang Y L, Xie W C. Fisher information matrix, Rao test, and Wald test for complex-valued signals and their applications. Signal Process 2014; 94:1-5.
37. Lori N F, Conturo T E, Le Bihan D. Definition of displacement probability and diffusion time in q-space magnetic resonance measurements that use finite-duration diffusion-encoding gradients. Journal of magnetic resonance 2003; 165(2):185-195.
38. Weigel M, Schwenk S, Kiselev V G, Scheffler K, Hennig J. Extended phase graphs with anisotropic diffusion. Journal of magnetic resonance 2010; 205(2):276-285.

39. Kuwata K, Brooks D, Yang H, Schleich T. Relaxation-matrix formalism for rotating-frame spin-lattice proton NMR relaxation and magnetization transfer in the presence of an off-resonance irradiation field. Journal of magnetic resonance Series B 1994; 104(1):11-25.
40. Pruessmann K P, Weiger M, Scheidegger M B, Boesiger P. SENSE: sensitivity encoding for fast MRI. Magnetic resonance in medicine: official journal of the Society of Magnetic Resonance in Medicine/Society of Magnetic Resonance in Medicine 1999; 42(5):952-962.
41. Lustig M, Donoho D, Pauly J M. Sparse MRI: The application of compressed sensing for rapid MR imaging. Magnetic resonance in medicine: official journal of the Society of Magnetic Resonance in Medicine/Society of Magnetic Resonance in Medicine 2007; 58(6):1182-1195.
42. Ma D, Gulani V, Seiberlich N, Liu K C, Sunshine J L, Duerk J L, Griswold M A. Magnetic resonance fingerprinting. Nature 2013; 495(7440: 187-192.

The invention claimed is:

1. A method for magnetic resonance imaging, comprising:
applying, continuously, a main magnetic field $B_0$ along a Z-axis on a sample; and
at least one set of repeated applications, on the sample and according to a period TR, of a sequence, said sequence comprising:
a radiofrequency pulse;
after the radiofrequency pulse of the sequence, a spatial gradient of the component along the Z-axis of the magnetic field; and
during repeated applications of the radiofrequency pulse and of the magnetic field spatial gradient of the sequence of one and the same set:
the radiofrequency pulse follows, between its different repeated applications, a periodic series:
for its amplitude;
for $u_{n+1}=v_{n+1}-v_n$, where n is an integer greater than or equal to 1 representing the repetition number of the sequence for this set, and where $u_{n+1}$ is a relative integer series making it possible to define the series $v_n$ to a nearest arbitrary constant $v_1$ such that $\varphi_n = v_n \times \Delta$ and $\varphi_n = \theta_n - \theta_{n-1}$ with $\Delta$ which is a constant real number for all of the repeated applications of the sequence of this set and $\varphi_n$ which is the increment between the phase $\theta_n$ of the radiofrequency pulse at its $n^{th}$ repetition in this set and the phase $\theta_{n-1}$ of the radiofrequency pulse at its $(n-1)^{th}$ repetition in this set, with $\theta_0$ an arbitrary value; and
each repeated application of the magnetic field spatial gradient of the sequence has, in a spatial gradient direction called encoding direction identical for each gradient application of this set, a non-zero temporal integral equal to A,
acquiring, during at least one of the repetitions of the sequence, of at least one nuclear magnetic resonance signal.

2. The method according to claim 1, wherein, during repeated applications of the radiofrequency pulse and of the magnetic field spatial gradient of the sequence of one and the same set, the series $u_{n+1}=v_{n+1}-v_n$ is a non-constant periodic series.

3. The method according to claim 1, wherein, during repeated applications of the radiofrequency pulse and of the magnetic field spatial gradient of the sequence of one and the same set, the amplitude of the radiofrequency pulse follows a non-constant periodic series.

4. The method according to claim 1, wherein the nuclear magnetic resonance signal is acquired at at least one dynamic steady state of the magnetization in the sample.

5. The method according to claim 4, wherein, during repeated applications of the radiofrequency pulse and of the magnetic field spatial gradient of the sequence of one and the same set, the series $u_{n+1}=v_{n+1}-v_n$ is a non-constant periodic series, or the amplitude of the radiofrequency pulse follows a non-constant periodic series, characterized in that during repeated applications of the radiofrequency pulse and of the magnetic field spatial gradient of the sequence of one and the same set:
the series $u_{n+1}=v_{n+1}-v_n$ is a non-constant periodic series, and/or
the amplitude of the radiofrequency pulse follows a non-constant periodic series,
so as to obtain different steady states of the magnetization in the sample interleaved within this set respectively for different periodic values of the series $u_{n+1}=v_{n+1}-v_n$ and/or of the amplitude of the radiofrequency pulse, and in that the nuclear magnetic resonance signal is acquired at these different interleaved steady states.

6. The method according to claim 4, wherein several sets are transmitted sequentially, with:
of $\Delta$ the value of which differs between the different sets; and/or
the amplitude of the radiofrequency pulse that follows a periodic series that differs between the different sets,
so as to obtain different sequential steady states of the magnetization in the sample for different values of $\Delta$ and/or of the amplitude, of which there is at least one steady state per set, and in that the nuclear magnetic resonance signal is acquired at these different sequential steady states.

7. The method according to claim 6, further comprising:
acquiring a signal for two steady states corresponding to two identical amplitudes of the radiofrequency pulse but two different values of $\Delta$;
comparing the signal for these two steady states; and
deducing, from this comparison, whether the amplitude of the radiofrequency pulse produces an effective flip angle that is larger or smaller than or equal to the Ernst angle for the sample.

8. The method according to claim 7, wherein one of the two different values of $\Delta$ is equal to zero.

9. The method according to claim 4, further comprising:
acquiring a signal for steady states corresponding to different amplitudes of the radiofrequency pulse and/or different values of $\Delta$ of different sets and/or different values of the periodic series $u_{n+1}=v_{n+1}-v_n$; and
determining, for at least one point in the sample, determining a nuclear magnetization, a magnetization flip angle, a diffusion coefficient, a longitudinal relaxation rate or time R1 or T1, and a transverse relaxation rate or time R2 or T2, based on a signal acquired for these steady states.

10. The method according to claim 9, wherein the determination is carried out either by comparison with a pre-calculated dictionary, or by iterative estimation, according to a minimization of a norm of the difference between the acquired signal expressed in complex form with a real part and an imaginary part, and a model of the signal expressed in complex form with a real part and an imaginary part.

11. The method according to claim 10, wherein the minimization comprises a least-square minimization, preferably using the Gauss-Newton algorithm applied to non-linear problems.

12. The method according to claim 9, further comprising acquiring a signal for steady states corresponding to different values of Δ, including:
- several points, for an absolute value of Δ between Δ=0° inclusive and Δ=32° inclusive modulo 360°; and/or
- several points, for an absolute value of Δ between Δ=164° inclusive et Δ=196° inclusive modulo 360°; and/or
- several points, for an absolute value of Δ between Δ=112° inclusive et Δ=128° inclusive modulo 360°; and/or
- several points for an absolute value of Δ from 45°, 60°, 72°, 90°, and 144° inclusive modulo 360°.

13. The method according to claim 9, wherein the amplitude of the radiofrequency pulse always corresponds to a magnetization flip angle:
- greater than the Ernst angle for a longitudinal relaxation time T1 equal to 2000 milliseconds, and
- less than or equal to 90°.

14. The method according to claim 9, wherein the determination comprises a spatial continuity condition of the nuclear magnetization, the magnetization flip angle, the diffusion coefficient, the longitudinal relaxation rate or time R1 or T1, and the transverse relaxation rate or time R2 or T2, between different points of the sample.

15. The method according to claim 1, wherein several sets are transmitted sequentially, and in that:
- the encoding direction differs between different sets; and/or
- the value of A differs between two sets; and/or
- the shape of the magnetic field gradient in the encoding direction differs between different sets.

16. The method according to claim 15, further comprising quantifying a diffusion coefficient in the sample or determining a predominant direction of diffusion in the sample or a weighting of the diffusion in the sample by making use of the difference in A and/or the encoding direction and/or gradient waveform between the different sets.

17. A device for magnetic resonance imaging, comprising:
means for continuous application of a main magnetic field $B_0$ along a Z-axis on a sample area; and
means for transmitting a magnetic field gradient and means for transmitting a radiofrequency pulse, and control means arranged in order to control the means for transmitting a magnetic field gradient and the means for transmitting a radiofrequency pulse, the control means being arranged, or programmed, in order to carry out at least one set of repeated applications, on the sample area and according to a period TR, of a sequence, said sequence comprising:
a radiofrequency pulse; and
after the radiofrequency pulse of the sequence, a spatial gradient of the component along the Z-axis of the magnetic field;
the control means are arranged or programmed so that, during repeated applications of the radiofrequency pulse and of the magnetic field spatial gradient of the sequence of one and the same set:
the radiofrequency pulse follows, between its different repeated applications, a periodic series:
for its amplitude;
for $u_{n+1}=v_{n+1}-v_n$, where n is an integer greater than or equal to 1 representing the repetition number of the sequence for this set, and where $u_{n+1}$ is a relative integer series making it possible to define the series $v_n$ to a nearest arbitrary constant $v_1$ such that $\varphi_n = v_n \times \Delta$ and $\varphi_n = \theta_n - \theta_{n-1}$ with Δ which is a constant real number for all of the repeated applications of the sequence of this set and $\varphi_n$ which is the increment between the phase $\theta_n$ of the radiofrequency pulse at its $n^{th}$ repartition in this set and the phase $\theta_{n-1}$ of the radiofrequency pulse at its $(n-1)^{th}$ repartition in this set, with $\theta_0$ an arbitrary value; and
each repeated application of the magnetic field spatial gradient of the sequence has, in a spatial gradient direction called encoding direction identical for each gradient application of this set, a non-zero temporal integral equal to A,
the device also comprising means for acquiring, during at least one of the repetitions of the sequence, at least one nuclear magnetic resonance signal.

18. The device according to claim 17, wherein the control means are arranged or programmed so that, during repeated applications of the radiofrequency pulse and of the magnetic field spatial gradient of the sequence of one and the same set, the series $u_{n+1}=v_{n+1}-v_n$ is a non-constant periodic series.

19. The device according to claim 17, wherein the control means are arranged or programmed so that, during repeated applications of the radiofrequency pulse and of the magnetic field spatial gradient of the sequence of one and the same set, the amplitude of the radiofrequency pulse follows a non-constant periodic series.

20. The method according to claim 17, wherein the control means are also arranged or programmed in order to control the acquisition means so as to acquire the nuclear magnetic resonance signal at at least one dynamic steady state of the magnetization in the sample area.

21. The device according to claim 20, wherein the control means are arranged or programmed so that, during repeated applications of the radiofrequency pulse and of the magnetic field spatial gradient of the sequence of one and the same set, the series $u_{n+1}=v_{n+1}-v_n$ is a non-constant periodic series or that the amplitude of the radiofrequency pulse follows a non-constant periodic series, characterized in that the control means are arranged or programmed so that, during repeated applications of the radiofrequency pulse and of the magnetic field spatial gradient of the sequence of one and the same set:
the series $u_{n+1}=v_{n+1}-v_n$ is a non-constant periodic series, and/or
the amplitude of the radiofrequency pulse follows a non-constant periodic series,
so as to obtain different interleaved steady states of the magnetization in the sample area within this set respectively for different periodic values of the series $u_{n+1}=v_{n+1}-v_n$ and/or of the amplitude of the radiofrequency pulse, the control means also being arranged or programmed in order to control the acquisition means so as to acquire the nuclear magnetic resonance signal at these different interleaved steady states.

22. The device according to claim 20, wherein the control means are arranged or programmed so that several sets are transmitted sequentially, with:
Δ the value of which differs between the different sets; and/or
the amplitude of the radiofrequency pulse that follows a periodic series that differs between the different sets,
so as to obtain different sequential steady states of the magnetization in the sample area for different values of Δ and/or of the amplitude including at least one steady state per set, the control means also being arranged or programmed in order to control the acquisition means so as to acquire the nuclear magnetic resonance signal at these different sequential steady states.

23. The device according to claim 22, wherein the control means are arranged or programmed in order to control the acquisition means so as to acquire a signal for two steady states corresponding to two identical amplitudes of the radiofrequency pulses but two different values of $\Delta$, the device also comprising calculation means arranged or programmed in order to:
compare the signal for these two steady states; and
deduce, from this comparison, whether the amplitude of the radiofrequency pulse produces an effective flip angle that is larger or smaller than or equal to the Ernst angle in the sample area.

24. The device according to claim 23, wherein one of the two different values of $\Delta$ is equal to zero.

25. The device according to claim 20, wherein the control means are arranged or programmed in order to control the acquisition means so as to acquire a signal for steady states corresponding to different amplitude of the radiofrequency pulses and/or two different values of $\Delta$ from different sets and/or different values of the periodic series $u_{n+1}=v_{n+1}-v_n$, the device also comprising calculation means arranged or programmed in order to, for at least one point in the sample area, determine a nuclear magnetization, a magnetization flip angle, a diffusion coefficient, a longitudinal relaxation rate or time R1 or T1, and a transverse relaxation rate or time R2 or T2, based on a signal acquired for these steady states.

26. The device according to claim 25, wherein the calculation means are arranged or programmed in order to perform this determination, either by comparison with a pre-calculated dictionary, or by iterative estimation, according to a minimization of a norm of the difference between the acquired signal expressed in complex form with a real part and an imaginary part, and a model of the signal expressed in complex form with a real part and an imaginary part.

27. The device according to claim 26, wherein the minimization comprises a least-square minimization, preferably using the Gauss-Newton algorithm applied to non-linear problems.

28. The device according to claim 25, wherein the control means are arranged or programmed in order to control the acquisition means so as to acquire a signal for steady states corresponding to two different values of $\Delta$ including:
several points, for an absolute value of $\Delta$ between $\Delta=0°$ inclusive and $\Delta=32°$ inclusive modulo 360°; and/or
several points, for an absolute value of $\Delta$ between $\Delta=164°$ inclusive et $\Delta=196°$ inclusive modulo 360°; and/or
several points, for an absolute value of $\Delta$ between $\Delta=112°$ inclusive et $\Delta=128°$ inclusive modulo 360°; and/or
several points for an absolute value of $\Delta$ from 45°, 60°, 72°, 90°, and 144° inclusive modulo 360°.

29. The device according to claim 25, wherein the control means are arranged or programmed so that the amplitude of the radiofrequency pulse always corresponds to a magnetization flip angle:
greater than the Ernst angle for a longitudinal relaxation time T1 equal to 2000 milliseconds; and
less than or equal to 90°.

30. The device according to claim 25, wherein the calculation means are arranged or programmed so that the determination comprises a spatial continuity condition of the nuclear magnetization, the magnetization flip angle, the diffusion coefficient, the longitudinal relaxation rate or time R1 or T1, and the transverse relaxation rate or time R2 or T2, between different points of the sample area.

31. The device according to claim 17, wherein the control means are arranged or programmed in order to transmit several sets sequentially, so that:
the encoding direction differs between different sets; and/or
the value of A differs between two sets; and/or
the shape of the magnetic field gradient in the encoding direction differs between different sets.

32. The device according to claim 31, further comprising calculation means arranged or programmed for:
quantifying a diffusion coefficient in the sample area or
determining a predominant direction of diffusion in the sample area or
weighting the diffusion in the sample area, by exploiting the difference in A and/or the encoding direction and/or gradient waveform between the different sets.

* * * * *